US012610715B2

(12) United States Patent
Yamabuchi

(10) Patent No.: US 12,610,715 B2
(45) Date of Patent: Apr. 21, 2026

(54) DISPLAY DEVICE, DISPLAY PANEL, AND METHOD FOR PRODUCING DISPLAY DEVICE

(71) Applicant: SHARP KABUSHIKI KAISHA, Sakai City (JP)

(72) Inventor: Koji Yamabuchi, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 411 days.

(21) Appl. No.: 18/279,371

(22) PCT Filed: Mar. 15, 2021

(86) PCT No.: PCT/JP2021/010390
§ 371 (c)(1),
(2) Date: Aug. 29, 2023

(87) PCT Pub. No.: WO2022/195679
PCT Pub. Date: Sep. 22, 2022

(65) Prior Publication Data
US 2024/0196692 A1 Jun. 13, 2024

(51) Int. Cl.
*H10K 59/80* (2023.01)
*H10K 59/12* (2023.01)
*H10K 59/35* (2023.01)

(52) U.S. Cl.
CPC ... *H10K 59/80515* (2023.02); *H10K 59/1201* (2023.02); *H10K 59/35* (2023.02)

(58) Field of Classification Search
CPC ......... H10K 59/80515; H10K 59/1201; H10K 59/35
See application file for complete search history.

(56) References Cited

U.S. PATENT DOCUMENTS

| | | | | |
|---|---|---|---|---|
| 11,049,920 B1* | 6/2021 | Zhao | ............... | H10K 59/121 |
| 11,594,579 B2* | 2/2023 | Xu | ............... | H10K 59/353 |
| 2012/0056531 A1* | 3/2012 | Park | ............... | H10K 50/125 |
| | | | | 313/506 |
| 2015/0001512 A1* | 1/2015 | Huang | ............... | H10K 59/353 |
| | | | | 118/504 |
| 2018/0247984 A1 | 8/2018 | Wang et al. | | |
| 2019/0237524 A1* | 8/2019 | Chen | ............... | H10K 59/8051 |
| 2019/0252469 A1* | 8/2019 | Xiao | ............... | G09G 3/3225 |
| 2020/0395422 A1* | 12/2020 | Xu | ............... | H10K 59/352 |

FOREIGN PATENT DOCUMENTS

JP 2018-526683 A 9/2018

* cited by examiner

*Primary Examiner* — Anne M Hines
(74) *Attorney, Agent, or Firm* — ScienBiziP, P.C.

(57) ABSTRACT

A display device includes a substrate, a first light-emitting element, a second light-emitting element, and a third light-emitting element on the substrate, and a shortest width along a first direction between a first contact surface where a first electrode of the first light-emitting element and a function layer of the first light-emitting element contact with each other and a second contact surface where a first electrode of the second light-emitting element and a function layer of the second light-emitting element contact with each other is smaller than a shortest width along a second direction orthogonal to the first direction between a third contact surface where a first electrode of the third light-emitting element and a function layer of the third light-emitting layer contact with each other and at least one of the first contact surface and the second contact surface.

20 Claims, 12 Drawing Sheets

DISPLAY DEVICE, DISPLAY PANEL, AND METHOD FOR PRODUCING DISPLAY DEVICE

TECHNICAL FIELD

The disclosure relates to a display device, display panel, and a manufacturing method of the display device.

BACKGROUND ART

In recent years, various display devices provided with a light-emitting element are developed. In particular, a display device provided with an Organic Light Emitting Diode (OLED) attracts a great deal of attention from perspectives such as the ability to achieve lower power consumption, a slimmer design, and higher picture quality.

However, in a manufacturing process of the display device provided with the OLED, it is not possible to secure a satisfactory process margin with respect to the accuracy of a separate-patterning of R/G/B pixels, and research for securing a wider process margin (design margin of a product) is actively being conducted.

For example, PTL 1 describes a display device provided with an OLED including a pixel arrangement including a first subpixel, a second subpixel, and a third subpixel, which can secure the wider process margin (design margin of a product).

CITATION LIST

Patent Literature

PTL 1: JP2018-526683 T

SUMMARY

Technical Problem

However, the display device provided with the OLED described in PTL 1 has a pixel configuration in which four first subpixels in total are disposed one by one on each side at the same distance from four sides which are end portions of the second subpixel, and similarly, four first subpixels in total are disposed one by one on each side at the same distance from four sides which are end portions of the third subpixel.

A vapor deposition mask generically used in a forming process of a light-emitting layer of the OLED is often formed, by fixing a plurality of divided masks to a mask frame in a state of being stretched in a stretching direction. In the case of such a vapor deposition mask, an alignment deviation (shift) amount of a plurality of vapor deposition openings included in each divided mask in a direction orthogonal to the stretching direction is larger than an alignment deviation (shift) amount in the stretching direction.

In the case of the display device provided with the OLED described in PTL 1, no consideration is given to the fact that the alignment deviation amount of the plurality of vapor deposition openings included in each divided mask included in the vapor deposition mask in the direction orthogonal to the stretching direction is larger than the alignment deviation amount in the stretching direction, and thus the above-described pixel configuration is adopted. Thus, in the display device provided with the OLED described in PTL 1, a problem is that the process margin (design margin of a product) is widened while the area of the light-emitting region in one pixel is unnecessarily narrowed.

An aspect of the disclosure has been made in light of the problem described above, and an objective of the aspect is to provide a display device, a display panel, and a manufacturing method of a display device that can secure the wider process margin (design margin of a product) without unnecessarily narrowing the area of the light-emitting region in one pixel.

Solution to Problem

In order to solve the above problem, a display device of the disclosure includes a substrate, a first light-emitting element, a second light-emitting element, and a third light-emitting element on the substrate, each including a first electrode, a function layer including a light-emitting layer, and a second electrode in this order from the substrate side, and a plurality of pixels each including the first light-emitting element, the second light-emitting element, and the third light-emitting element, and a shortest width W1 along a first direction between a first contact surface formed by the first electrode of the first light-emitting element and the function layer of the first light-emitting element being in contact with each other and a second contact surface formed by the first electrode of the second light-emitting element and the function layer of the second light-emitting element being in contact with each other is smaller than a shortest width W2 along a second direction orthogonal to the first direction between a third contact surface formed by the first electrode of the third light-emitting element and the function layer of the third light-emitting element being in contact with each other and at least one of the first contact surface and the second contact surface.

In order to solve the above problem, a display panel of the disclosure includes a plurality of the display devices, and the substrate included in each of the plurality of display devices is integrally formed, the plurality of display devices include a first display device, a second display device, and a third display device, a value of the shortest width W2/the shortest width W1 in each of the plurality of pixels of the second display device is larger than a value of the shortest width W2/the shortest width W1 in each of the plurality of pixels of the first display device and a value of the shortest width W2/the shortest width W1 in each of the plurality of pixels of the third display device, the first display device is disposed at an end portion on one side in the first direction of the substrate being integrally formed, the third display device is disposed at an end portion on the other side in the first direction of the substrate being integrally formed, and the second display device is disposed at an intermediate position between the first display device and the third display device.

In order to solve the above problem, a manufacturing method of a display device of the disclosure is a manufacturing method of a display device including, on a substrate, a plurality of pixels each including a first light-emitting element, a second light-emitting element, and a third light-emitting element, the manufacturing method includes forming a first electrode on the substrate;

forming an edge cover layer, the edge cover layer covering an end portion of each of the first electrode of the first light-emitting element, the first electrode of the second light-emitting element, and the first electrode of the third light-emitting element, including a first opening exposing a part of the first electrode of the first light-emitting element, a second opening exposing a part of the first electrode of the second light-emitting element, and a third opening exposing a part of the first electrode of the third light-emitting element, the first opening and the second opening being disposed to be adjacent to each other for each of the plurality of pixels in one of an (N−1)-th row and an N-th row (N is an even number of 2 or greater) along the first direction, the third opening being disposed for each of the plurality of pixels in the other of the (N−1)-th row and the N-th row, and a shortest width W1 along the first direction between the first opening and the second opening being smaller than a shortest width W2 along a second direction orthogonal to the first direction between the third opening and at least one of the first opening and the second opening, forming a first light-emitting layer of the first light-emitting element, a second light-emitting layer of the second light-emitting element, and a third light-emitting layer of the third light-emitting element; and forming a second electrode on the first light-emitting layer of the first light-emitting element, on the second light-emitting layer of the second light-emitting element, and on the third light-emitting layer of the third light-emitting element.

Advantageous Effects of Disclosure

An aspect of the disclosure can provide a display device, a display panel, and a manufacturing method of a display device that can secure a wider process margin (design margin of a product) without unnecessarily narrowing an area of the light-emitting region in one pixel.

DESCRIPTION OF EMBODIMENTS

Figure 1:
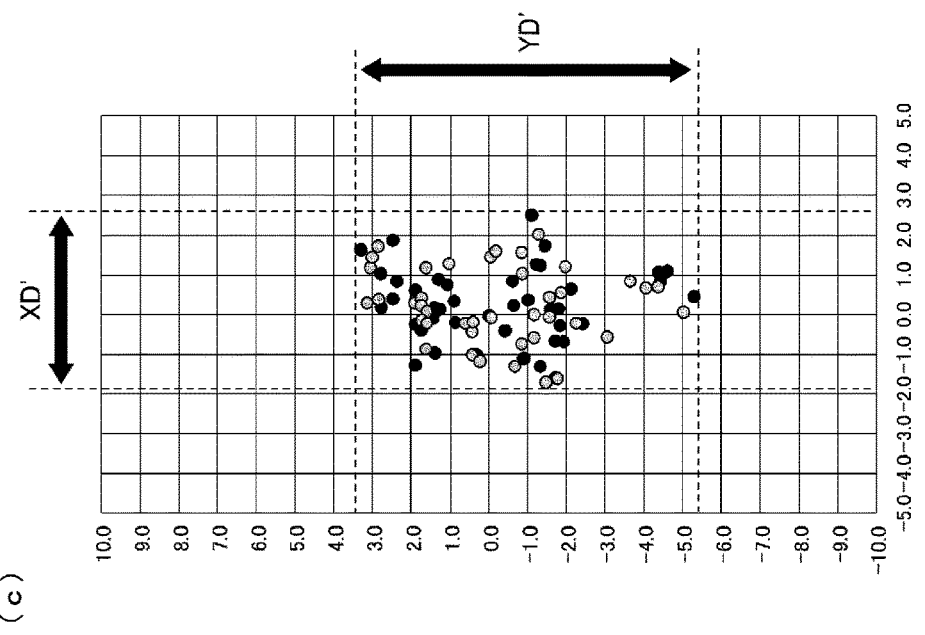
FIG. 1(a) is a plan view illustrating a schematic configuration of a divided mask included in a vapor deposition mask used in a manufacturing process of a display device of a first embodiment.
FIG. 1(b) is a plan view illustrating a schematic configuration of the vapor deposition mask used in the manufacturing process of the display device of the first embodiment.
FIG. 1(c) is a view showing that a deviation amount of a plurality of vapor deposition openings included in each divided mask of the vapor deposition mask illustrated in FIG. 1(b) in a direction orthogonal to a stretching direction is different from a deviation amount in the stretching direction.
Figure 1:
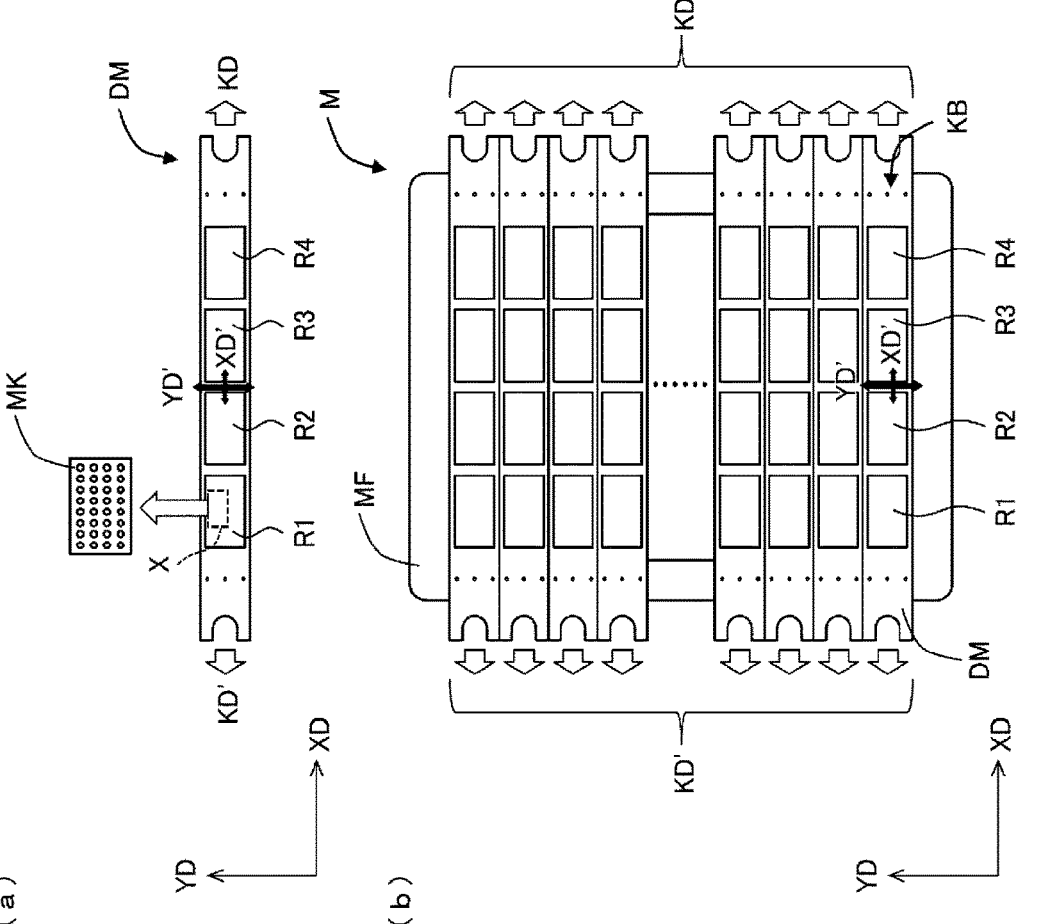

A description follows regarding embodiments of the disclosure, with reference to FIGS. 1 to 12. Hereinafter, for convenience of explanation, components having the same functions as those described in a specific embodiment are denoted by the same reference numerals, and descriptions thereof will be omitted.

First Embodiment (a) of FIG. 1 is a plan view illustrating a schematic configuration of a divided mask DM included in a vapor deposition mask M used in a manufacturing process of a display device 1 of a first embodiment.

The divided mask DM illustrated in (a) of FIG. 1 is obtained by, for example, subjecting a 30 μm-thick invar sheet material, which is in roll form, to exposing, developing, and etching processes for forming vapor deposition openings MK illustrated in a partially enlarged view of an X portion in (a) of FIG. 1, and a cutting process for obtaining individual units. Note that the thickness of the invar sheet material is preferably greater than or equal to 10 μm and less than or equal to 50 μm, and is 30 μm in the present embodiment. However, no such limitation is intended.

Furthermore, in the present embodiment, a case will be described as an example in which the divided mask DM is formed using the invar sheet material. However, no such limitation is intended. The divided mask DM may be formed using a thin metal sheet material, a thin alloy sheet material, or the like instead of the invar sheet material.

As illustrated in (a) of FIG. 1, when the divided mask DM is stretched in a stretching direction KD along a first direction XD, which is the left-right direction in the drawing, and in a stretching direction KD' opposite to the stretching direction KD, an alignment deviation (shift) amount YD' of a plurality of vapor deposition openings MK included in the divided mask DM in a second direction YD orthogonal to the stretching directions KD and KD' is larger than an alignment deviation (shift) amount XD' in the first direction XD, which is the stretching directions KD and KD'.

In the present embodiment, as illustrated in (a) of FIG. 1, a case will be described as an example in which the divided mask DM includes a first vapor deposition opening group R1 including the plurality of vapor deposition openings MK, a second vapor deposition opening group R2 including the plurality of vapor deposition openings MK, a third vapor deposition opening group R3 including the plurality of vapor deposition openings MK, and a fourth vapor deposition opening group R4 including the plurality of vapor deposition openings MK. However, no such limitation is intended. The number of vapor deposition opening groups can be determined as appropriate.

One vapor deposition opening group corresponds to one display device, and thus when the first vapor deposition opening group R1 to the fourth vapor deposition opening group R4 are provided as in the divided mask DM, one divided mask DM corresponds to four display devices.

The alignment deviation amount YD' of the plurality of vapor deposition openings MK in the second direction YD during vapor deposition increases from both ends toward a central portion of the divided mask DM in the first direction XD. That is, the alignment deviation amount YD' of the plurality of vapor deposition openings MK belonging to the second vapor deposition opening group R2 and the third vapor deposition opening group R3 in the second direction YD is larger than the alignment deviation amount YD' of the plurality of vapor deposition openings MK belonging to the first vapor deposition opening group R1 and the fourth vapor deposition opening group R4 in the second direction YD. On the other hand, the alignment deviation (shift) amount XD' of the plurality of vapor deposition openings MK in the first direction XD is determined by accuracy at the time of stretching the mask, and there is no large difference in the alignment deviation amount XD' between both ends and the central portion of the divided mask DM in the first direction XD. That is, there is no large difference in the alignment deviation (shift) amount XD' of the plurality of vapor deposition openings MK belonging to the first vapor deposition opening group R1, the second vapor deposition opening group R2, the third vapor deposition opening group R3 and the fourth vapor deposition opening group R4 in the first direction XD.

(b) of FIG. 1 is a plan view illustrating a schematic configuration of the vapor deposition mask M used in the manufacturing process of the display device 1 of the first embodiment.

As illustrated in (b) of FIG. 1, the vapor deposition mask M is formed such that a plurality of divided masks DM are fixed without any gap to a mask frame MF having a frame-like shape and including a large opening in a central portion by a fixing portion KB in a state of being stretched in the stretching directions KD and KD'.

The vapor deposition mask M illustrated in (b) of FIG. 1 is a vapor deposition mask used in the process of forming the green light-emitting layer in the manufacturing process of the display device 1 of the first embodiment, and in the manufacturing process of the display device 1 of the first embodiment, although not illustrated, the vapor deposition mask used in the process of forming the red light-emitting layer and the vapor deposition mask used in the process of forming the blue light-emitting layer formed in the same manner as the vapor deposition mask M illustrated in (b) of FIG. 1 are further used.

(c) of FIG. 1 is a view showing the fact that the alignment deviation amount YD' of the plurality of vapor deposition openings MK included in each divided mask DM of the vapor deposition mask M in the direction YD orthogonal to the stretching directions KD and KD' and the alignment deviation amount XD' in the stretching directions KD and KD' illustrated in (b) of FIG. 1 are different at the time of vapor deposition alignment.

Black dots and gray dots in (c) of FIG. 1 are each an example of a measurement result of the deviation amount of each of the plurality of vapor deposition openings MK of the vapor deposition mask M used in the process of forming the green light-emitting layer in the manufacturing process of the display device 1 according to the first embodiment, and indicate distributions of the deviation amounts XD' and YD' of the plurality of vapor deposition openings MK in the first direction XD and the second direction YD, respectively. The black dots are the results of the deviation amounts XD' and YD' of some of the plurality of vapor deposition openings MK belonging to the second vapor deposition opening group R2 of the vapor deposition mask M, and the gray dots are the results of the deviation amounts XD' and YD' of some of the plurality of vapor deposition openings MK belonging to the third vapor deposition opening group R3 of the vapor deposition mask M. In any of the results, the deviation amount YD' in the direction YD orthogonal to the stretching directions KD and KD' is about twice the deviation amount XD' in the stretching directions KD and KD'. Although not illustrated, in the manufacturing process of the display device 1 according to the first embodiment formed in the same manner as the vapor deposition mask M illustrated in (b) of FIG. 1, the same applies to the result of the deviation amount of the vapor deposition openings of the vapor deposition mask used in the process of forming the red light-emitting layer and the result of the deviation amount of the vapor deposition openings of the vapor deposition mask used in the process of forming the blue light-emitting layer.

Figure 2:
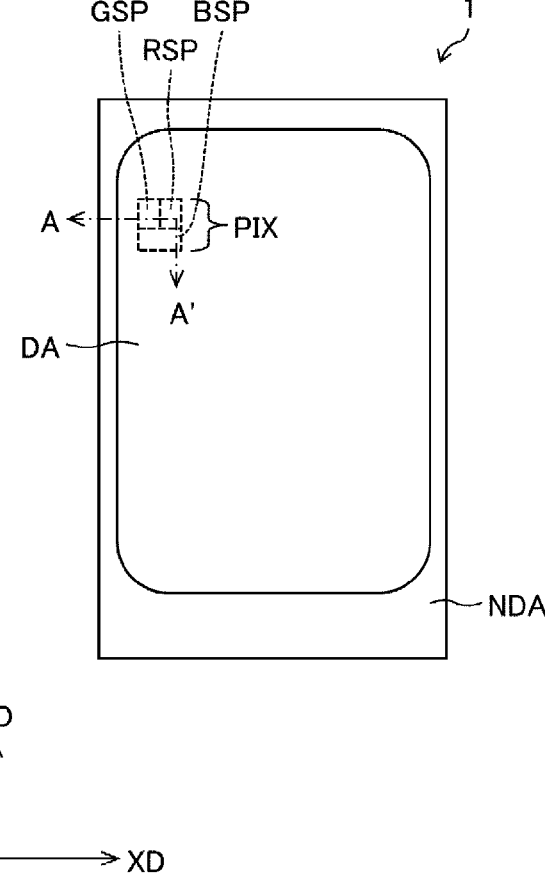
FIG. 2 is a plan view illustrating a schematic configuration of the display device according to the first embodiment.

FIG. 2 is a plan view illustrating a schematic configuration of the display device 1 according to the first embodiment.

As illustrated in FIG. 2, the display device 1 includes a frame region NDA and a display region DA. A plurality of pixels PIX are provided in the display region DA of the display device 1, and each pixel PIX includes a red subpixel RSP, a green subpixel GSP, and a blue subpixel BSP. In the present embodiment, a case will be described as an example in which one pixel PIX includes the red subpixel RSP, the green subpixel GSP, and the blue subpixel BSP, but no such limitation is intended. For example, one pixel PIX may further include a subpixel of another color in addition to the red subpixel RSP, the green subpixel GSP, and the blue subpixel BSP. Arrangement positions, shapes, and sizes of the red subpixel RSP, the green subpixel GSP, and the blue subpixel BSP constituting one pixel PIX illustrated in FIG. 2 are merely examples, and no such limitation is intended, and can be determined as appropriate.

Figure 3:
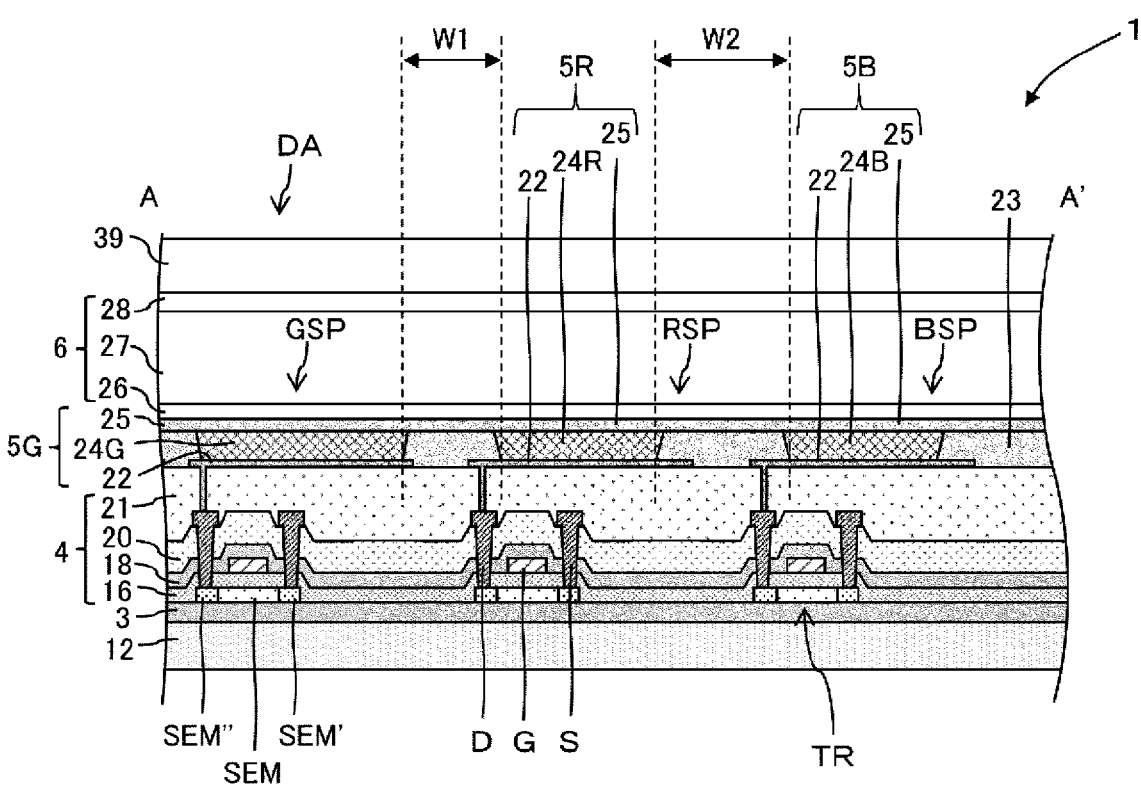
FIG. 3 is a cross-sectional view illustrating a schematic configuration of the display device according to the first embodiment taking along line A-A' illustrated in FIG. 2.

FIG. 3 is a cross-sectional view illustrating a schematic configuration of the display device 1 according to the first embodiment taking along line A-A' illustrated in FIG. 2.

As illustrated in FIG. 3, in the display region DA of the display device 1, a barrier layer 3, a thin film transistor layer 4 including transistors TRs, a red light-emitting element 5R, a green light-emitting element 5G, a blue light-emitting element 5B, an edge cover layer 23, a sealing layer 6, and a function film 39 are provided on a substrate 12 in this order from the substrate 12 side.

The green subpixel GSP provided in the display region DA of the display device 1 includes a green light-emitting element 5G (first light-emitting element), the red subpixel RSP provided in the display region DA of the display device 1 includes a red light-emitting element 5R (second light-emitting element), and the blue subpixel BSP provided in the display region DA of the display device 1 includes a blue light-emitting element 5B (third light-emitting element). The green light-emitting element 5G included in the green subpixel GSP includes a first electrode 22 (anode), a function layer 24G including a green light-emitting layer, and a second electrode 25 (cathode), the red light-emitting element 5R included in the red subpixel RSP includes the first electrode 22 (anode), a function layer 24R including a red light-emitting layer, and the second electrode 25 (cathode), and the blue light-emitting element 5B included in the blue subpixel BSP includes the first electrode 22 (anode), a function layer 24B including a blue light-emitting layer, and the second electrode 25 (cathode).

The substrate 12 may be, for example, a resin substrate made of a resin material such as polyimide, or may be a glass substrate. In the present embodiment, the display device 1 is a flexible display device, and thus a case will be described as an example in which the resin substrate made of the resin material such as polyimide is used as the substrate 12. However, no such limitation is intended. In a case where the display device 1 is a non-flexible display device, the glass substrate may be used as the substrate 12.

The barrier layer 3 is a layer that inhibits foreign matter, such as water and oxygen, from entering the transistor TR, the red light-emitting element 5R, the green light-emitting element 5G, and the blue light-emitting element 5B, and can be formed of, for example, a silicon oxide film, a silicon nitride film, or a silicon oxynitride film, or a layered film thereof formed by chemical vapor deposition (CVD).

The transistor TR portion of the thin film transistor layer 4 including the transistor TR includes a semiconductor film SEM, doped semiconductor films SEM' and SEM", an inorganic insulating film 16, a gate electrode G, an inorganic insulating film 18, an inorganic insulating film 20, a source electrode S. a drain electrode D, and a flattening film 21. A portion other than the transistor TR portion of the thin film transistor layer 4 including the transistor TR includes the inorganic insulating film 16, the inorganic insulating film 18, the inorganic insulating film 20, and the flattening film 21.

The semiconductor films SEM, SEM' and SEM" may be formed of low-temperature polysilicon (LTPS) or an oxide semiconductor (for example, an In—Ga—Zn—O based semiconductor), for example. In the example of the present embodiment described herein, the transistor TR has a top gate structure. However, no such limitation is intended, and the transistor TR may have a bottom gate structure.

The gate electrode G, the source electrode S, and the drain electrode D may be formed of a single-layer film or a layered film of a metal including, for example, at least one of aluminum, tungsten, molybdenum, tantalum, chromium, titanium, or copper.

The inorganic insulating film 16, the inorganic insulating film 18, and the inorganic insulating film 20 may be formed of a silicon oxide film, a silicon nitride film, a silicon-oxide-nitride film, or a layered film of these, formed using CVD.

The flattening film 21 may be formed of coatable organic materials such as polyimide and acrylic.

The green light-emitting element 5G includes a first electrode 22 (anode) that is an upper layer overlying the flattening film 21, the function layer 24G including a green light-emitting layer, and the second electrode 25 (cathode). The red light-emitting element 5R includes the first electrode 22 (anode) that is an upper layer overlying the flattening film 21, the function layer 24R including the red light-emitting layer, and the second electrode 25 (cathode). The blue light-emitting element 5B includes a first electrode 22 (anode) that is an upper layer overlying the flattening film 21, the function layer 24B including the blue light-emitting layer, and the second electrode 25 (cathode). Note that the edge cover layer 23 with insulating properties covering the edge of the first electrode 22 (anode) is formed, for example, by applying an organic material, such as polyimide or acrylic, and then patterning the organic material by photolithography.

The function layer 24G including the green light-emitting layer may be formed by layering, for example, a hole injection layer, a hole transport layer, the green light-emitting layer, an electron transport layer, and an electron injection layer in this order from the first electrode 22 (anode) side. Of the hole injection layer, the hole transport layer, the electron transport layer, and the electron injection layer in the function layer 24G including the green light-emitting layer, one or more layers except for the green light-emitting layer may be omitted as appropriate. In the present embodiment, a case will be described as an example in which the function layer 24G including the green light-emitting layer is formed by layering, for example, the hole injection layer, the hole transport layer, the green light-emitting layer, the electron transport layer, and the electron injection layer in this order from the first electrode 22 (anode) side. However, no such limitation is intended.

The function layer 24R including the red light-emitting layer may be formed by layering, for example, the hole injection layer, the hole transport layer, the red light-emitting layer, the electron transport layer, and the electron injection layer in this order from the first electrode 22 (anode) side. Of the hole injection layer, the hole transport layer, the electron transport layer, and the electron injection layer in the function layer 24R including the red light-emitting layer, one or more layers except for the red light-emitting layer may be omitted as appropriate. In the present embodiment, a case will be described as an example in which the function layer 24R including the red light-emitting layer is formed by layering, for example, the hole injection layer, the hole transport layer, the red light-emitting layer, the electron transport layer, and the electron injection layer in this order from the first electrode 22 (anode) side. However, no such limitation is intended.

The function layer 24B including the blue light-emitting layer may be formed by layering, for example, the hole injection layer, the hole transport layer, the blue light-emitting layer, the electron transport layer, and the electron injection layer in this order from the first electrode 22 (anode) side. Of the hole injection layer, the hole transport layer, the electron transport layer, and the electron injection layer in the function layer 24B including the blue light-emitting layer, one or more layers except for the blue light-emitting layer may be omitted as appropriate. In the present embodiment, a case will be described as an example in which the function layer 24B including the blue light-emitting layer is formed by layering, for example, the hole injection layer, the hole transport layer, the blue light-emitting layer, the electron transport layer, and the electron injection layer in this order from the first electrode 22 (anode) side. However, no such limitation is intended.

In the present embodiment, a case will be described as an example in which each of the function layer 24R including the red light-emitting layer, the function layer 24G including the green light-emitting layer, and the function layer 24B including the blue light-emitting layer includes the hole injection layer formed using the same material in the same process, the hole transport layer formed using the same material in the same process, the electron transport layer formed using the same material in the same process, and the electron injection layer formed using the same material in the same process. However, no such limitation is intended. For example, the hole injection layers included respectively in the function layers 24R, 24G, and 24B may be formed of materials different from each other. For example, the hole injection layers each included in a respective one of two function layers of the function layers 24R, 24G, and 24B may be formed of the same material in the same process, and only the hole injection layer included in the remaining one function layer may be formed of a different material in another process. In addition, for example, the hole transport layers included respectively in the function layers 24R, 24G, and 24B may be formed of materials different from each other. For example, the hole transport layers included respectively in two function layers of the function layers 24R, 24G, and 24B may be formed of the same material in the same process, and only the hole transport layer included in the remaining one function layer may be formed of a different material in another process. For example, the electron transport layers included respectively in the function layers 24R, 24G, and 24B may be formed of materials different from each other. For example, the electron transport layers included respectively in two function layers of the function layers 24R, 24G, and 24B may be formed of the same material in the same process, and only the electron transport layer included in the remaining one function layer may be formed of a different material in another process. In addition, for example, the electron injection layers included respectively in the function layers 24R, 24G, and 24B may be formed of materials different from each other. For example, the electron injection layers included respectively in two function layers of the function layers 24R, 24G, and 24B may be formed of the same material in the same process, and only the electron injection layer included in the remaining one function layer may be formed of a different material in another process.

A control circuit including the transistors TR that respectively control the red light-emitting element 5R, the green light-emitting element 5G, and the blue light-emitting element 5B is provided in the thin film transistor layer 4 including the transistors TR for the respective red subpixel RSP, the green subpixel GSP, and the blue subpixel BSP. Note that the control circuit including the transistor TR and the light-emitting element provided for each red subpixel RSP, green subpixel GSP, and blue subpixel BSP are collectively referred to as a subpixel circuit.

The red light-emitting element 5R, the green light-emitting element 5G, and the blue light-emitting element 5B illustrated in FIG. 3 may be a top-emitting type or a bottom-emitting type. The red light-emitting element 5R, the green light-emitting element 5G, and the blue light-emitting element 5B have ordered-layered structures in which the first electrode 22 (anode), the function layers 24R, 24G, and 24B and the second electrode 25 (cathode) are formed in this order from the substrate 12 side, and thus the second electrode 25 (cathode) is disposed as an upper layer above the first electrode 22 (anode). Thus, to realize the top-emitting type, the first electrode 22 (anode) may be formed of an electrode material that reflects visible light and the second electrode 25 (cathode) may be formed of an electrode material that allows visible light through. To realize the bottom-emitting type, the first electrode 22 (anode) may be formed of an electrode material that allows visible light through and the second electrode 25 (cathode) may be formed of an electrode material that reflects visible light. On the other hand, although not illustrated, when the red light-emitting element 5R, the green light-emitting element 5G, and the blue light-emitting element 5B have inverse-layered structures in which the first electrode 22 (cathode), the function layer 24R, 24G, and 24B and the second electrode 25 (anode) are formed in this order from the substrate 12 side, the second electrode 25 (anode) is disposed above the first electrode 22 (cathode) as an upper layer above. Thus, to realize the top-emitting type, the first electrode 22 (cathode) may be formed of an electrode material that reflects visible light and the second electrode 25 (anode) may be formed of an electrode material that allows visible light through. To realize the bottom-emitting type, the second electrode 25 (anode) may be formed of an electrode material that reflects visible light and the first electrode 22 (cathode) may be formed of an electrode material that allows visible light through.

The electrode material that reflects visible light is not particularly limited as long as the material can reflect visible light and has electrical conductivity, Examples include metal materials such as Al, Mg, Li, and Ag, alloys of the metal materials, a layered body of the metal materials and transparent metal oxides (for example, indium tin oxide, indium zinc oxide, indium gallium zinc oxide, and the like), a layered body of the alloys and the transparent metal oxides.

On the other hand, the electrode material that allows visible light through is not particularly limited as long as the material can allow visible light through and has electrical conductivity. Examples include a thin film formed of a transparent metal oxide (for example, indium tin oxide, indium zinc oxide, indium gallium zinc oxide, and the like) or a metal material, such as Al, Mg, Li, and Ag.

A typical electrode forming method may be used as a film formation method of the first electrode 22 (anode) and the second electrode 25 (cathode), and examples thereof include physical vapor deposition (PVD) such as vacuum vapor deposition, a sputtering method, electron beam (EB) vapor deposition, and an ion plating method, or chemical vapor deposition (CVD). Further, the method of patterning the first electrode 22 (anode) and the second electrode 25 (cathode) is not particularly limited as long as the method is capable of precisely forming a desired pattern, and specific examples include a photolithography method and an ink-jet method.

The sealing layer 6 is a transparent film and, for example, may be formed of an inorganic sealing film 26 for covering the second electrode 25 (cathode), an organic film 27 that is an upper layer overlying the inorganic sealing film 26, and an inorganic sealing film 28 that is an upper layer overlying the organic film 27. The sealing layer 6 inhibits foreign matters such as water and oxygen from penetrating into the red light-emitting element 5R, the green light-emitting element 5G, and the blue light-emitting element 5B.

The inorganic sealing film 26 and the inorganic sealing film 28 are both inorganic films and may be formed of, for example, a silicon oxide film, a silicon nitride film, a silicon oxynitride film, or a layered film of these, formed by CVD. The organic film 27 is a transparent organic film having a flattening effect, and may be formed of a coatable organic material such as acrylic, for example. The organic film 27 may be formed by an ink-jet method, for example. In the example of the present embodiment described herein, the sealing layer 6 is formed of one layer of an organic film provided between two layers of an inorganic film and two layers of an inorganic film. However, the layering order of the two layers of an inorganic film and the one layer of an organic film is not limited thereto. Further, the sealing layer 6 may be formed of only an inorganic film, may be formed of only an organic film, may be formed of one layer of an inorganic film and two layers of an organic film, or may be formed of two or more layers of an inorganic film and two or more layers of an organic film.

The function film 39 is a film with at least one of an optical compensation function, a touch sensor function, or a protection function, for example.

As illustrated in FIG. 3, in the display device 1, a shortest width W1 along the first direction XD between a first contact surface formed by the first electrode 22 of the green light-emitting element 5G and the function layer 24G including the green light-emitting layer being in contact with each other and a second contact surface formed by the first electrode 22 of the red light-emitting element 5R and the function layer 24R including the red light-emitting layer being in contact with each other is smaller than a shortest width W2 along the second direction YD orthogonal to the first direction XD between a third contact surface formed by the first electrode 22 of the blue light-emitting element 5B and the function layer 24B including the blue light-emitting layer being in contact with each other and at least one of the first contact surface and the second contact surface.

In the case of the display device 1, in order to secure the wider process margin (design margin of a product), the shortest width W2 along the second direction YD between the third contact surface and at least one of the first contact surface and the second contact surface is set to a relatively large value of 22 μm, for example, while in order not to unnecessarily narrow the area of the light-emitting region in one pixel, the shortest width W1 along the first direction XD between the first contact surface and the second contact surface is set to a relatively small value of 18 μm, for example. Thus, when at least one of the green light-emitting layer, the red light-emitting layer, and the blue light-emitting layer is formed using the vapor deposition mask in which the deviation amount YD' of the plurality of vapor deposition openings MK included in each divided mask DM in the second direction YD orthogonal to the stretching directions KD and KD' is larger than the deviation amount XD' in the first direction XD, which is the stretching directions KD and KD', the wider process margin (design margin of a product) can be secured without unnecessarily narrowing the area of the light-emitting region in one pixel. In the present embodiment, the case has been described as an example in which the shortest width W2 is 22 μm and the shortest width W1 is 18 μm. However, no such limitation is intended, as long as the shortest width W2 is larger than the shortest width W1, and the value of the shortest width W2/the shortest width W1 is preferably 1.2 or greater and 1.5 or less.

Figure 4:
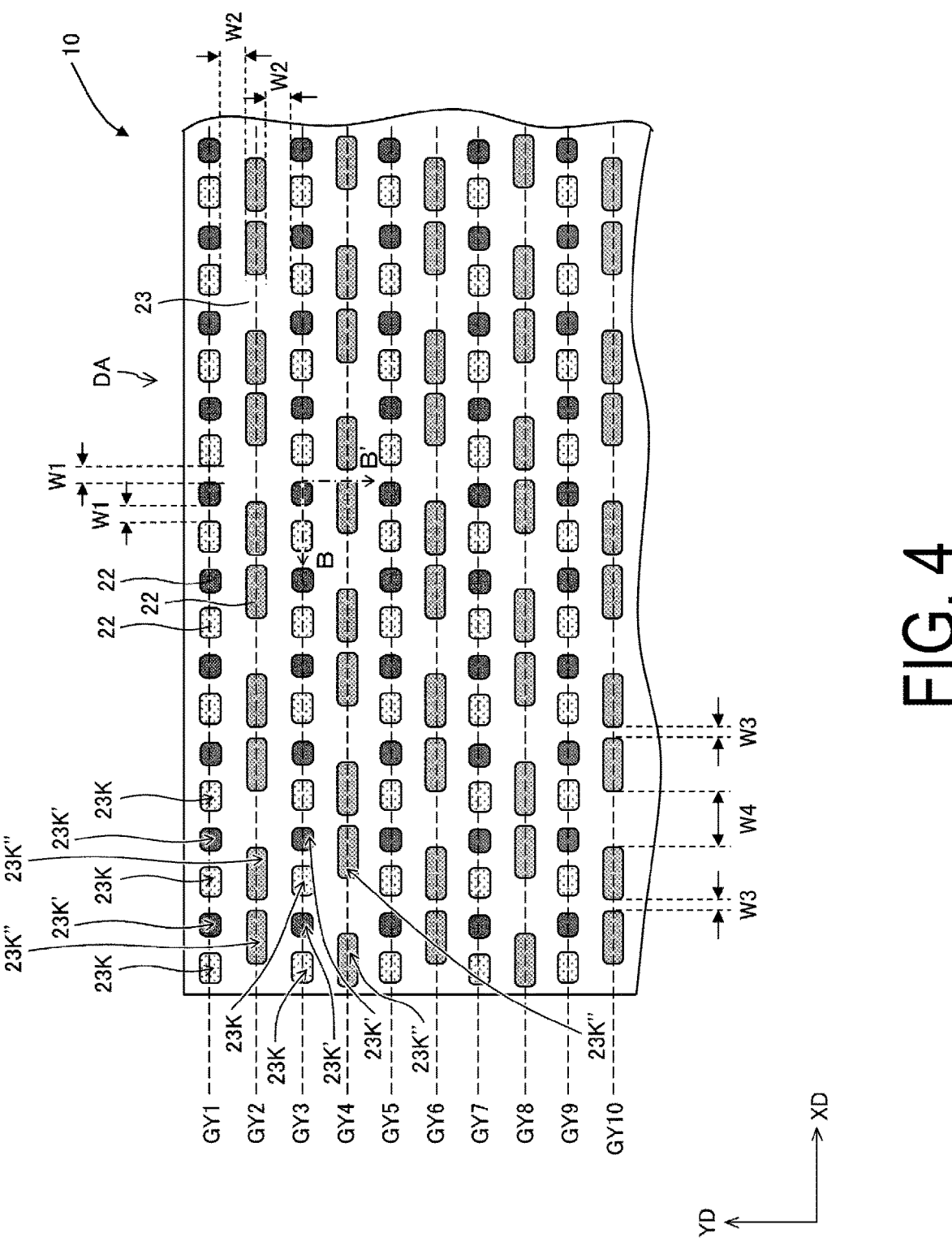
FIG. 4 is a plan view illustrating a schematic configuration of an active matrix substrate included in the display device according to the first embodiment, in which up to an edge cover layer including a first opening, a second opening, and a third opening is formed on the active matrix substrate.

FIG. 4 is a plan view illustrating a schematic configuration of an active matrix substrate 10 included in the display device 1 according to the first embodiment, in which up to an edge cover layer 23 including a first opening 23K, a second opening 23$k'$, and a third opening 23$k''$ is formed on the active matrix substrate 10.

Figure 5:
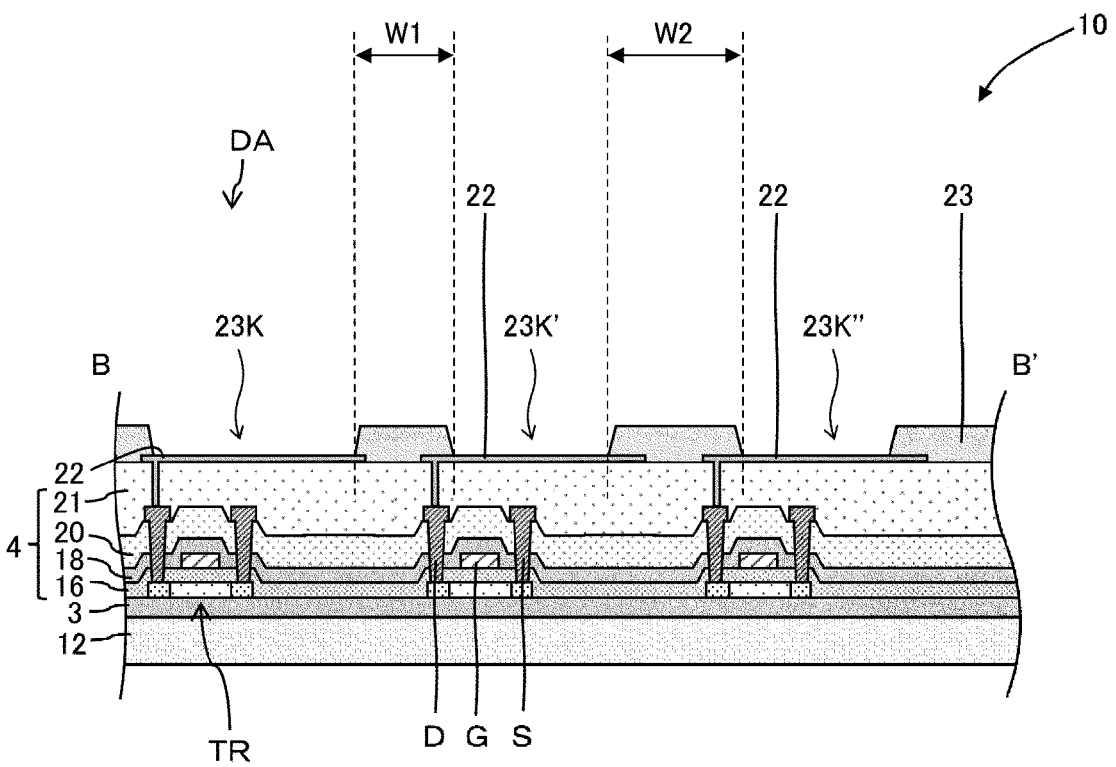
FIG. 5 is a cross-sectional view illustrating a schematic configuration of the active matrix substrate taking along line B-B' illustrated in FIG. 4.

FIG. 5 is a cross-sectional view illustrating a schematic configuration of the active matrix substrate 10 taking along line B-B' illustrated in FIG. 4.

Figure 6:
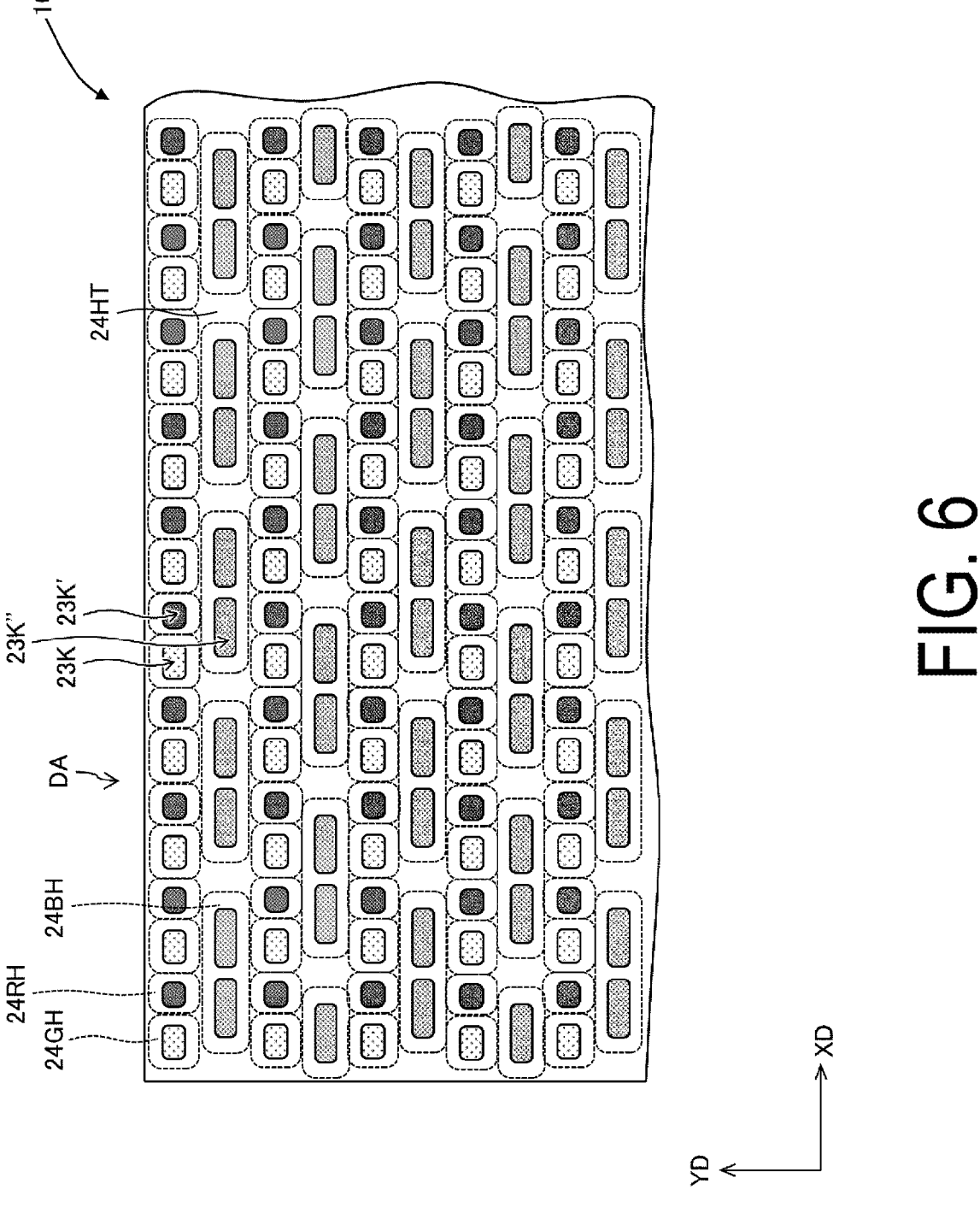
FIG. 6 is a view illustrating a state after forming a hole transport layer, a green light-emitting layer, a red light-emitting layer, and a blue light-emitting layer in this order on the active matrix substrate illustrated in FIGS. 4 and 5.

FIG. 6 is a view illustrating a state after forming a hole transport layer 24HT, a green light-emitting layer 24GH, a red light-emitting layer 24RH, and a blue light-emitting layer 24BH in this order on the active matrix substrate 10 illustrated in FIGS. 4 and 5.

A manufacturing method of the display device 1 provided with the plurality of pixels PIX each including the red light-emitting element 5R, the green light-emitting element 5G, and the blue light-emitting element 5B on the substrate 12 includes a first electrode forming process of forming the first electrode 22 on the substrate 12 as illustrated in FIG. 5, an edge cover layer forming process of forming the edge cover layer 23 as illustrated in FIGS. 4 and 5, a light-emitting layer forming process of forming the green light-emitting layer 24GH of the green light-emitting element 5G, the red light-emitting layer 24RH of the red light-emitting element 5R, and the blue light-emitting layer 24BH of the blue light-emitting element 5B as illustrated in FIG. 6, and a second electrode forming process of forming the second electrode 25 on the function layer 24G including the green light-emitting layer 24GH of the green light-emitting element 5G, on the function layer 24R including the red light-emitting layer 24RH of the red light-emitting element 5R, and on the function layer 24B including the blue light-emitting layer 24BH of the blue light-emitting element 5B as illustrated in FIG. 3.

As illustrated in FIGS. 4 and 5, in the edge cover layer forming process of forming the edge cover layer 23, the edge cover layer 23 is formed, in which the edge cover layer 23 covers each end portion of the first electrode 22 of the green light-emitting element 5G, the first electrode 22 of the red light-emitting element 5R, and the first electrode 22 of the blue light-emitting element 5B is covered, and includes the first opening 23K exposing a part of the first electrode 22 of the green light-emitting element 5G, the second opening 23K' exposing a part of the first electrode 22 of the red light-emitting element 5R, and the third opening 23K" exposing a part of the first electrode 22 of the blue light-emitting element 5B, the first opening 23K and the second opening 23K' are disposed to be adjacent to each other for each pixel PIX in one of an (N−1)-th row and an N-th row (N is an even number of 2 or greater) along the first direction XD, the third opening 23K" is disposed for each pixel PIX in the other of the (N−1)-th row and the N-th row, and the shortest width W1 along the first direction XD between the first opening 23K and the second opening 23K' is smaller than the shortest width W2 along the second direction YD orthogonal to the first direction XD between the third opening 23K" and at least one of the first opening 23K and the second opening 23K'.

Note that the first opening 23K of the edge cover layer 23 has the same shape as the first contact surface formed by the first electrode 22 of the green light-emitting element 5G and the function layer 24G including the green light-emitting layer being in contact with each other, the second openings 23K' of the edge cover layer 23 has the same shape as the second contact surface formed by the first electrode 22 of the red light-emitting element 5R and the function layer 24R including the red light-emitting layer being in contact with each other, and the third opening 23K" of the edge cover layer 23 has the same shape as the third contact surface formed by the first electrode 22 of the blue light-emitting element 5B and the function layer 24B including the blue light-emitting layer being in contact with each other.

Accordingly, the green light-emitting element 5G including the first contact surface and the red light-emitting element 5R including the second contact surface are disposed adjacent to each other for each pixel PIX in one of the (N−1)-th row and the N-th row (N is an even number of 2 or greater) along the first direction XD, and the blue light-emitting element 5B including the third contact surface is disposed for each pixel PIX in the other of the (N−1)-th row and the N-th row.

As described above, in order to secure the wider process margin (design margin of a product), the shortest width W2 along the second direction YD between the third opening 23K″ and at least one of the first opening 23K and the second opening 23K′ is set to the relatively large value of 22 μm, for example, while in order not to unnecessarily narrow the area of the light-emitting region in one pixel, the shortest width W1 along the first direction XD between the first opening 23K and the second opening 23K′ is set to the relatively small value of 18 μm, for example. Thus, in the manufacturing method of the display device 1, when at least one of the green light-emitting layer, the red light-emitting layer, and the blue light-emitting layer is formed using the vapor deposition mask in which the deviation amount YD′ of the plurality of vapor deposition openings MK included in each divided mask DM in the second direction YD orthogonal to the stretching directions KD and KD′ is larger than the deviation amount XD′ in the first direction XD, which is the stretching directions KD and KD′, the wider process margin (design margin of a product) can be secured without unnecessarily narrowing the area of the light-emitting region in one pixel. In the present embodiment, the case has been described as an example in which the shortest width W2 along the second direction YD between the third opening 23K″ and at least one of the first opening 23K and the second opening 23K′ is 22 μm, and the shortest width W1 along the first direction XD between the first opening 23K and the second opening 23K′ is 18 μm. However, no such limitation is intended, as long as the shortest width W2 is larger than the shortest width W1, and the value of the shortest width W2/the shortest width W1 is preferably 1.2 or greater and 1.5 or less.

In the present embodiment, as illustrated in FIG. 4, the first opening 23K and the second opening 23K′ are disposed adjacent to each other for each pixel PIX in an odd-numbered row such as a first row GY1, a third row GY3, a fifth row GY5, a seventh row GY7 and a ninth row GY9 along the first direction XD, and the third openings 23K″ is disposed for each pixel PIX in an even-numbered row such as a second row GY2, a fourth row GY4, a sixth row GY6, an eighth row GY8, and a tenth row GY10 along the first direction XD.

In the present embodiment, as illustrated in FIG. 4, a width of the third opening 23K″ of the edge cover layer 23 in the first direction XD is larger than a width obtained by combining one of a width of the first opening 23K of the edge cover layer 23 in the first direction XD and a width of the second opening 23K′ of the edge cover layer 23 in the first direction XD and the shortest width W1 along the first direction XD between the first opening 23K and the second opening 23K′, and the first openings 23K and the second opening 23K's are alternately disposed in an odd-numbered row such as the first row GY1, the third row GY3, the fifth row GY5, the seventh row GY7 and the ninth row GY9 along the first direction XD. That is, a case will be described as an example in which a width of the third contact surface formed by the first electrode 22 of the blue light-emitting element 5B and the function layer 24B including the blue light-emitting layer being in contact with each other in the first direction XD is larger than a width obtained by combining one of a width of the first contact surface formed by the first electrode 22 of the green light-emitting element 5G and the function layer 24G including the green light-emitting layer being in contact with each other in the first direction XD and a width of the second contact surface formed by the first electrode 22 of the red light-emitting element 5R and the function layer 24R including the red light-emitting layer being in contact with each other in the first direction XD and the shortest width W1 along the first direction XD between the first contact surface and the second contact surface, and the green light-emitting elements 5Gs each including the first contact surface and the red light-emitting elements 5Rs each including the second contact surface are alternately disposed in the odd-numbered row such as the first row GY1, the third row GY3, the fifth row GY5, the seventh row GY7 and the ninth row GY9 along the first direction XD. However, no such limitation is intended.

In the present embodiment, as illustrated in FIG. 4, the size of the third opening 23K″ of the edge cover layer 23 is larger than the size of the first opening 23K of the edge cover layer 23 and the size of the second opening 23K′ of the edge cover layer 23. That is, a case will be described as an example in which the size of the third contact surface formed by the first electrode 22 of the blue light-emitting element 5B and the function layer 24B including the blue light-emitting layer being in contact with each other is larger than the size of the first contact surface formed by the first electrode 22 of the green light-emitting element 5G and the function layer 24G including the green light-emitting layer being in contact with each other in the first direction XD and the size of the second contact surface formed by the first electrode 22 of the red light-emitting element 5R and the function layer 24R including the red light-emitting layer being in contact with each other in the first direction XD. However, no such limitation is intended.

Further, in the present embodiment, as illustrated in FIG. 4, when the first pixel PIX, the second pixel PIX, and the third pixel PIX are three pixels adjacent to each other disposed in this order along the first direction XD, a shortest width W3 along the first direction XD between the third opening 23K″ of the edge cover layer 23 included in one of the first pixel PIX and the third pixel PIX and the third opening 23K″ of the edge cover layer 23 included in the second pixel PIX is smaller than a shortest width W4 along the first direction XD between the third opening 23K″ of the edge cover layer 23 included in the other of the first pixel PIX and the third pixel PIX and the third opening 23K″ of the edge cover layer 23 included in the second pixel PIX. That is, a case will be described as an example in which when the first pixel PIX, the second pixel PIX, and the third pixel PIX are three pixels adjacent to each other disposed in this order along the first direction XD, the shortest width W3 along the first direction XD between the third contact surface formed by the first electrode 22 of the blue light-emitting element 5B and the function layer 24B including the blue light-emitting layer included in one of the first pixel PIX and the third pixel PIX and the third contact surface formed by the first electrode 22 of the blue light-emitting element 5B and the function layer 24B including the blue light-emitting layer included in the second pixel PIX being in contact with each other is smaller than the shortest width W4 along the first direction XD between the third contact surface formed by the first electrode 22 of the blue light-emitting element 5B and the function layer 24B including the blue light-emitting layer included in the other of the first pixel PIX and the third pixel PIX and the third contact surface formed by the first electrode 22 of the blue light-emitting element 5B and the function layer 24B including the blue light-emitting layer included in the second pixel PIX being in contact with each other. However, no such limitation is intended.

As illustrated in FIG. 6, the hole transport layer 24HT was formed over the entire surface of the display region DA on the active matrix substrate 10 illustrated in FIGS. 4 and 5, and then the green light-emitting layer 24GH, the red light-emitting layer 24RH, and the blue light-emitting layer 24BH were formed in this order as follows.

In the process of forming the green light-emitting layer 24GH, as illustrated in (b) of FIG. 1, the green light-emitting layer 24GH was formed on the first electrode 22 of the green light-emitting element 5G exposed via the first opening 23K by using the vapor deposition mask M including the plurality of vapor deposition openings MK formed corresponding to the positions of the first openings 23K of the edge cover layer 23 in the same shape and at the same pitch and stretched in the first direction XD and the direction opposite to the first direction XD. In FIG. 6, each vapor deposition region of the green light-emitting layer 24GH is indicated by a dotted line.

In the process of forming the red light-emitting layer 24RH, the red light-emitting layer 24RH was formed on the first electrode 22 of the red light-emitting element 5R exposed via the second openings 23K' by using the vapor deposition mask for the red light-emitting layer 24RH including the plurality of vapor deposition openings formed corresponding to the positions of the second openings 23K' of the edge cover layer 23 in the same shape and at the same pitch formed similarly to the vapor deposition mask M illustrated in (b) of FIG. 1 and stretched in the first direction XD and the direction opposite to the first direction XD. In FIG. 6, each vapor deposition region of the red light-emitting layer 24RH is indicated by a dotted line.

In the process of forming the blue light-emitting layer 24BH, the blue light-emitting layer 24BH was formed on the first electrode 22 of the blue light-emitting element 5B exposed via the third opening 23K" by using the vapor deposition mask for the blue light-emitting layer 24BH including the plurality of vapor deposition openings formed corresponding to the positions of the third openings 23K" of the edge cover layer 23 in the same shape and at the same pitch formed similarly to the vapor deposition mask M illustrated in (b) of FIG. 1 and stretched in the first direction XD and the direction opposite to the first direction XD. In FIG. 6, each vapor deposition region of the blue light-emitting layer 24BH is indicated by a dotted line.

In the present embodiment, a case will be described as an example in which the green light-emitting layer 24GH, the red light-emitting layer 24RH, and the blue light-emitting layer 24BH are formed in this order. However, no such limitation is intended and the light-emitting layers may be formed in any order.

Figure 7:
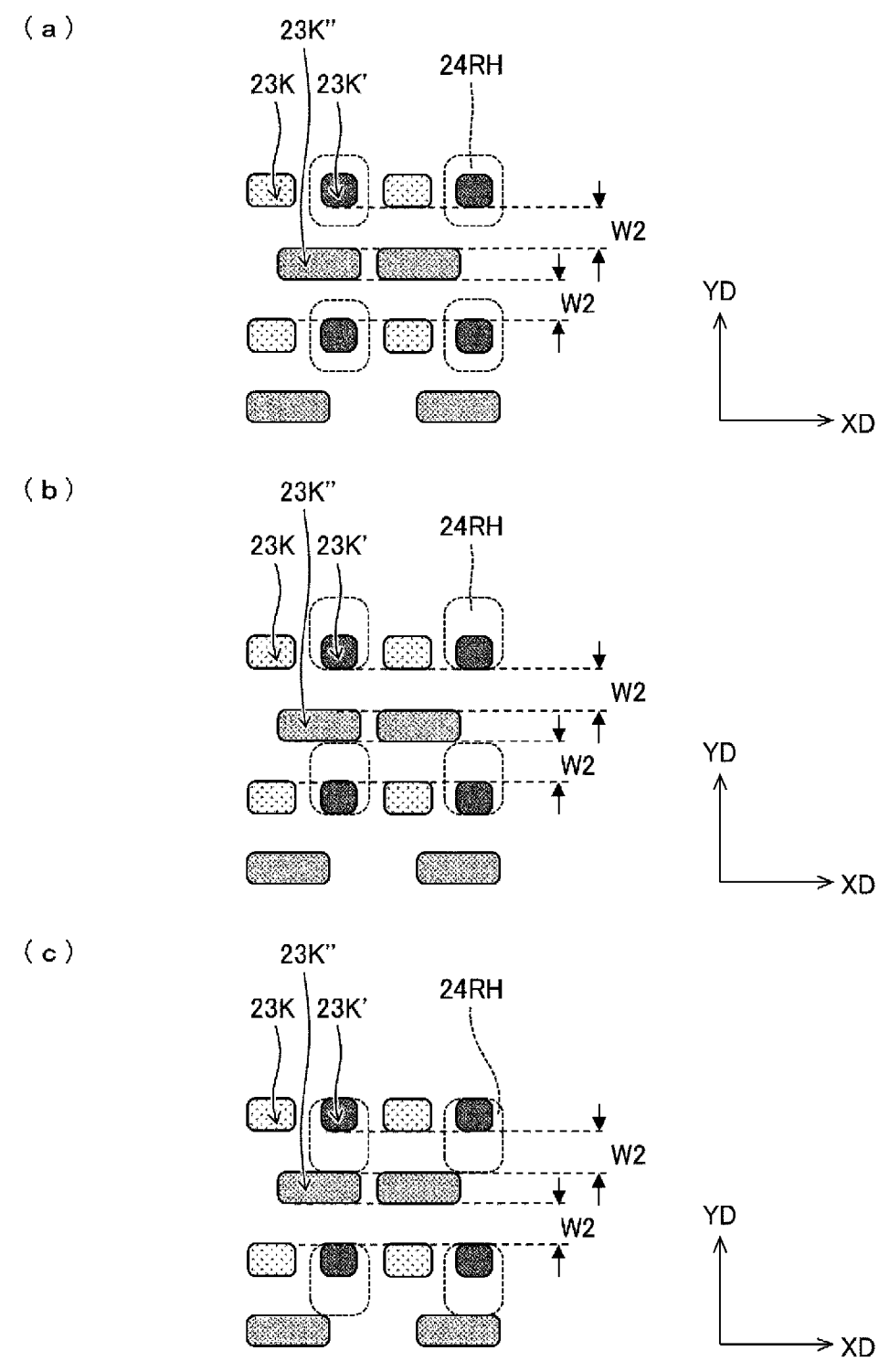
FIGS. 7(a), 7(b), and 7(c) are views for explaining the reason why a wider process margin can be secured in a forming process of the red light-emitting layer provided in a red light-emitting element of the display device of the first embodiment.

(a) of FIG. 7, (b) of FIG. 7, and (c) of FIG. 7 are views for explaining the reason why the wider process margin can be secured in the forming process of the red light-emitting layer 24RH provided in the red light-emitting element 5R of the display device 1 of the first embodiment.

(a) of FIG. 7 illustrates each vapor deposition region of red light-emitting layer 24RH in a case where there is almost no alignment deviation (shift) amount YD' of the plurality of vapor deposition openings of the vapor deposition mask for the red light-emitting layer 24RH in the second direction YD.

(b) of FIG. 7 illustrates each vapor deposition region of the red light-emitting layer 24RH in a case where the alignment deviation (shift) amount YD' of the plurality of vapor deposition openings of the vapor deposition mask for the red light-emitting layer 24RH in the second direction YD is the allowable maximum value in the upward direction in the drawing. When the allowable maximum value is exceeded, the red light-emitting layer 24RH is deposited in the third opening 23K" of the edge cover layer 23, and thus color mixing is generated in the blue light-emitting element 5B, or the red light-emitting layer 24RH is not deposited in a part of the second opening 23K' of the edge cover layer 23 to narrow the light-emitting region of the red light-emitting element 5R.

(c) of FIG. 7 illustrates each vapor deposition region of the red light-emitting layer 24RH in a case where the alignment deviation (shift) amount YD' of the plurality of vapor deposition openings of the vapor deposition mask for the red light-emitting layer 24RH in the second direction YD is the allowable maximum value in the downward direction in the drawing. When the allowable maximum value is exceeded, the red light-emitting layer 24RH is deposited in the third opening 23K" of the edge cover layer 23, and thus color mixing is generated in the blue light-emitting element 5B, or the red light-emitting layer 24RH is not deposited in a part of the second opening 23K' of the edge cover layer 23 to narrow the light-emitting region of the red light-emitting element 5R.

In the present embodiment, the shortest width W2 along the second direction YD between the third opening 23K" and at least one of the first opening 23K and the second opening 23K' is set to the relatively large value of 22 μm, for example, the wider process margin (design margin of a product) can be secured in the process of forming the red light-emitting layer 24RH.

Figure 8:
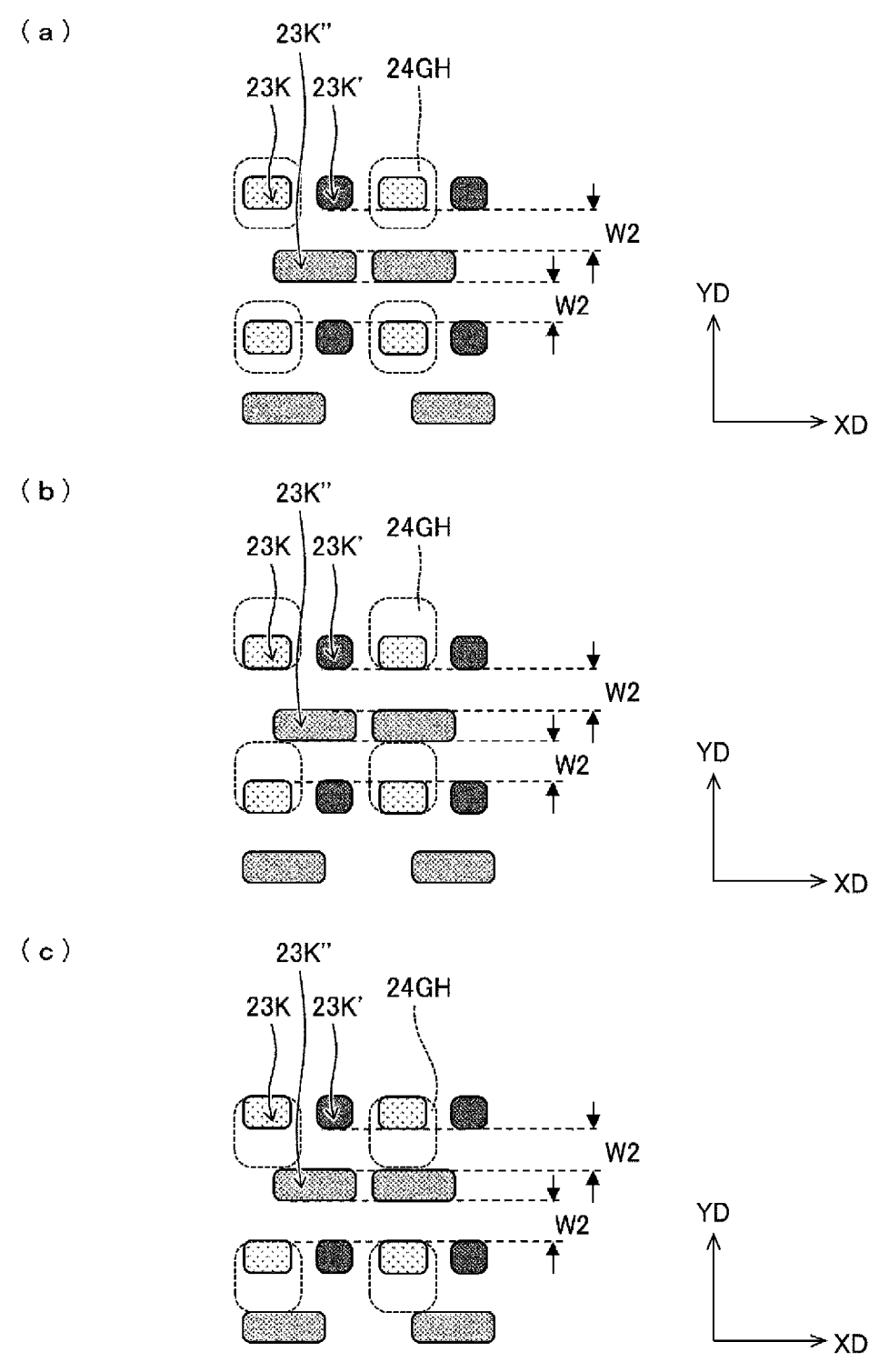
FIGS. 8(a), 8(b), and 8(c) are views for explaining the reason why a wider process margin can be secured in a forming process of the green light-emitting layer provided in a green light-emitting element of the display device of the first embodiment.

(a) of FIG. 8, (b) of FIG. 8, and (c) of FIG. 8 are views for explaining the reason why the wider process margin can be secured in the forming process of the green light-emitting layer 24GH provided in the green light-emitting element 5G of the display device 1 of the first embodiment.

(a) of FIG. 8 illustrates each vapor deposition region of the green light-emitting layer 24GH in a case where there is almost no alignment deviation (shift) amount YD' of the plurality of vapor deposition openings MK of the vapor deposition mask M for the green light-emitting layer 24GH in the second direction YD.

(b) of FIG. 8 illustrates each vapor deposition region of the green light-emitting layer 24GH in a case where the alignment deviation (shift) amount YD' of the plurality of vapor deposition openings MK of the vapor deposition mask M for the green light-emitting layer 24GH in the second direction YD is the allowable maximum value in the upward direction in the drawing. When the allowable maximum value is exceeded, the green light-emitting layer 24GH is deposited in the third opening 23K" of the edge cover layer 23, and thus color mixing is generated in the blue light-emitting element 5B, or the green light-emitting layer 24GH is not deposited in a part of the first opening 23K of the edge cover layer 23 to narrow the light-emitting region of the green light-emitting element 5G.

(c) of FIG. 8 illustrates each vapor deposition region of the green light-emitting layer 24GH in a case where the alignment deviation (shift) amount YD' of the plurality of vapor deposition openings MK of the vapor deposition mask M for the green light-emitting layer 24GH in the second direction YD is the allowable maximum value in the downward direction in the drawing. When the allowable maximum value is exceeded, the green light-emitting layer 24GH is deposited in the third opening 23K" of the edge cover layer 23, and thus color mixing is generated in the blue light-emitting element 5B, or the green light-emitting layer 24GH is not deposited in a part of the first opening 23K of the edge cover layer 23 to narrow the light-emitting region of the green light-emitting element 5G.

In the present embodiment, the shortest width W2 along the second direction YD between the third opening 23K" and at least one of the first opening 23K and the second opening 23K' is set to the relatively large value of 22 µm, for example, the wider process margin (design margin of a product) can be secured in the process of forming the green light-emitting layer 24GH.

Figure 9:
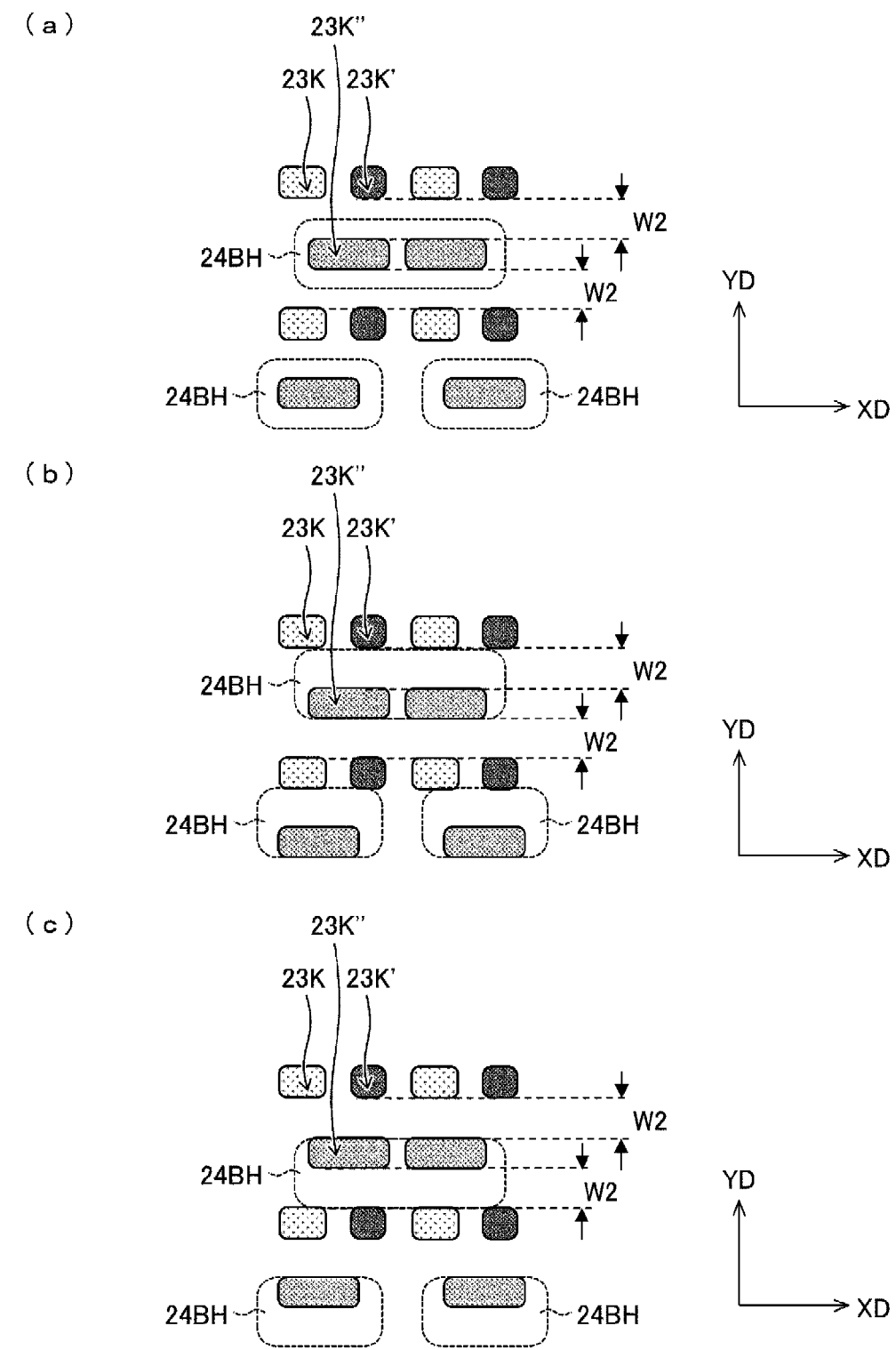
FIGS. 9(a), 9(b), and 9(c) are views for explaining the reason why a wider process margin can be secured in a forming process of the blue light-emitting layer provided in a blue light-emitting element of the display device of the first embodiment.

(a) of FIG. 9, (b) of FIG. 9, and (c) of FIG. 9 are views for explaining the reason why the wider process margin can be secured in the forming process of the blue light-emitting layer 24BH provided in the blue light-emitting element 5B of the display device 1 of the first embodiment.

(a) of FIG. 9 illustrates each vapor deposition region of the blue light-emitting layer 24BH in a case where there is almost no alignment deviation (shift) amount YD' of the plurality of vapor deposition openings of the vapor deposition mask for the blue light-emitting layer 24BH in the second direction YD.

(b) of FIG. 9 illustrates each vapor deposition region of the blue light-emitting layer 24BH in a case where the alignment deviation (shift) amount YD' of the plurality of vapor deposition openings of the vapor deposition mask for the blue light-emitting layer 24BH in the second direction YD is the allowable maximum value in the upward direction in the drawing. When the allowable maximum value is exceeded, the blue light-emitting layer 24BH is deposited in the first opening 23K and the second opening 23K' of the edge cover layer 23, and thus color mixing is generated in the green light-emitting element 5G and the red light-emitting element 5R, or the blue light-emitting layer 24BH is not deposited in a part of the third opening 23K" of the edge cover layer 23 to narrow the light-emitting region of the blue light-emitting element 5B.

(c) of FIG. 9 illustrates each vapor deposition region of the blue light-emitting layer 24BH in a case where the alignment deviation (shift) amount YD' of the plurality of vapor deposition openings of the vapor deposition mask for the blue light-emitting layer 24BH in the second direction YD is the allowable maximum value in the downward direction in the drawing. When the allowable maximum value is exceeded, the blue light-emitting layer 24BH is deposited in the first opening 23K and the second opening 23K' of the edge cover layer 23, and thus color mixing is generated in the green light-emitting element 5G and the red light-emitting element 5R, or the blue light-emitting layer 24BH is not deposited in a part of the third opening 23K" of the edge cover layer 23 to narrow the light-emitting region of the blue light-emitting element 5B.

In the present embodiment, the shortest width W2 along the second direction YD between the third opening 23K" and at least one of the first opening 23K and the second opening 23K' is set to the relatively large value of 22 µm, for example, the wider process margin (design margin of a product) can be secured in the process of forming the blue light-emitting layer 24BH.

In the present embodiment, as described above, the green light-emitting layer 24GH, the red light-emitting layer 24RH, and the blue light-emitting layer 24BH were formed on a large display panel by using the three vapor deposition masks (the vapor deposition mask for the green light-emitting layer, the vapor deposition mask for the red light-emitting layer, and the vapor deposition mask for the blue light-emitting layer) each having the size illustrated in (b) of FIG. 1. A large display panel includes a plurality of display devices 1, and the plurality of display devices 1 can be obtained by performing a dividing process of dividing such a large display panel.

In the present embodiment, the case has been described as an example in which in each display device 1 included in the large display panel, the shortest width W2 along the second direction YD between the third opening 23K" and at least one of the first opening 23K and the second opening 23K' is 22 µm, and the shortest width W1 along the first direction XD between the first opening 23K and the second opening 23K' is 18 µm, that is, the value of the shortest width W2/the shortest width W1 is the same in each of the display devices 1 included in the large display panel. However, no such limitation is intended and as long as the shortest width W2 is larger than the shortest width W1 as in a second embodiment and a third embodiment described later, the value of the shortest width W2/the shortest width W1 of each of the display devices included in the large display panel may be different.

Second Embodiment

Next, a second embodiment of the disclosure will be described with reference to FIG. 10 and FIG. 11. Each of display devices 1A to 1H included in a large display panel 50 of the present embodiment is different from the above-described first embodiment in that the values of the shortest width W2/the shortest width W1 of some display devices are different. Other configurations are as described in the first embodiment. For convenience of explanation, components having the same functions as those described in diagrams of the first embodiment are denoted by the same reference numerals, and descriptions thereof will be omitted.

Figure 10:
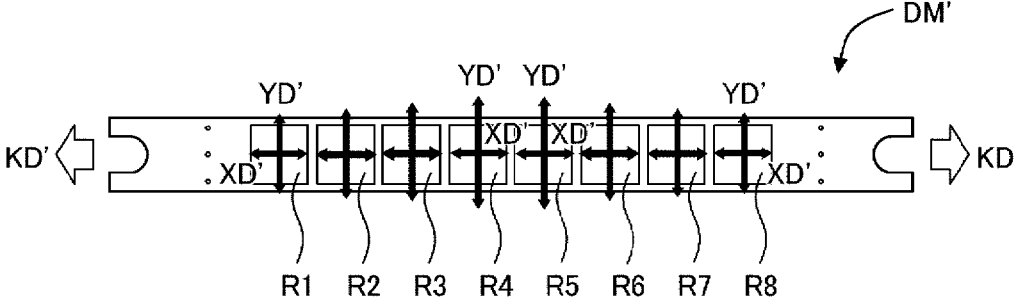
FIG. 10 is a plan view illustrating a schematic configuration of a divided mask included in a vapor deposition mask used in a manufacturing process of a display panel of a second embodiment.
Figure 10:
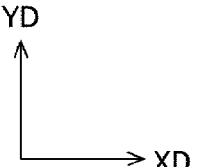

FIG. 10 is a plan view illustrating a schematic configuration of a divided mask DM' included in a vapor deposition mask used in a manufacturing process of the display panel 50 of a second embodiment.

The divided mask DM' illustrated in FIG. 10 is provided with the first vapor deposition opening group R1 to the eighth vapor deposition opening group R8, and thus one divided mask DM' corresponds to eight display devices.

A manufacturing method of the vapor deposition mask including the plurality of divided masks DM' illustrated in FIG. 10 is the same as the manufacturing method of the vapor deposition mask M including the plurality of divided masks DM already described in the first embodiment, and thus the description thereof will be omitted here.

In the case of the divided mask DM' illustrated in FIG. 10, the alignment deviation amount YD' of the plurality of vapor deposition openings included in the divided mask DM' in the second direction YD increases from both ends toward the central portion of the divided mask DM' in the first direction XD. That is, the alignment deviation amount YD' of the plurality of vapor deposition openings belonging to the fourth vapor deposition opening group R4 and the fifth vapor deposition opening group R5 in the second direction YD is larger than the alignment deviation amount YD' of the plurality of vapor deposition openings belonging to the first vapor deposition opening group R1 and the eighth vapor deposition opening group R8 in the second direction YD. Further, the alignment deviation amount YD' of the plurality of vapor deposition openings belonging to the second vapor deposition opening group R2 and the seventh vapor deposition opening group R7 in the second direction YD is larger than the alignment deviation amount YD' of the plurality of vapor deposition openings belonging to the first vapor deposition opening group R1 and the eighth vapor deposition opening group R8 in the second direction YD, and the alignment deviation amount YD' of the plurality of vapor deposition openings belonging to the third vapor deposition opening group R3 and the sixth vapor deposition opening group R6 in the second direction YD is larger than the alignment deviation amount YD' of the plurality of vapor deposition openings belonging to the second vapor deposition opening group R2 and the seventh vapor deposition opening group R7' in the second direction YD. On the other hand, the alignment deviation (shift) amount XD' of the plurality of vapor deposition openings included in the divided mask DM' in the first direction XD has no large difference between the both ends and the central portion of the divided mask DM' in the first direction XD. That is, there is no large difference in the alignment deviation (shift) amount XD' of the plurality of vapor deposition openings belonging to the first vapor deposition opening group R1 to the eighth vapor deposition opening group R8 in the first direction XD.

In the present embodiment, a case will be described as an example in which a vapor deposition mask including a plurality of divided masks DM's illustrated in FIG. 10. However, no such limitation is intended, and for example, the vapor deposition mask M including the plurality of divided masks DM illustrated in (b) of FIG. 1 may be used.

Figure 11:
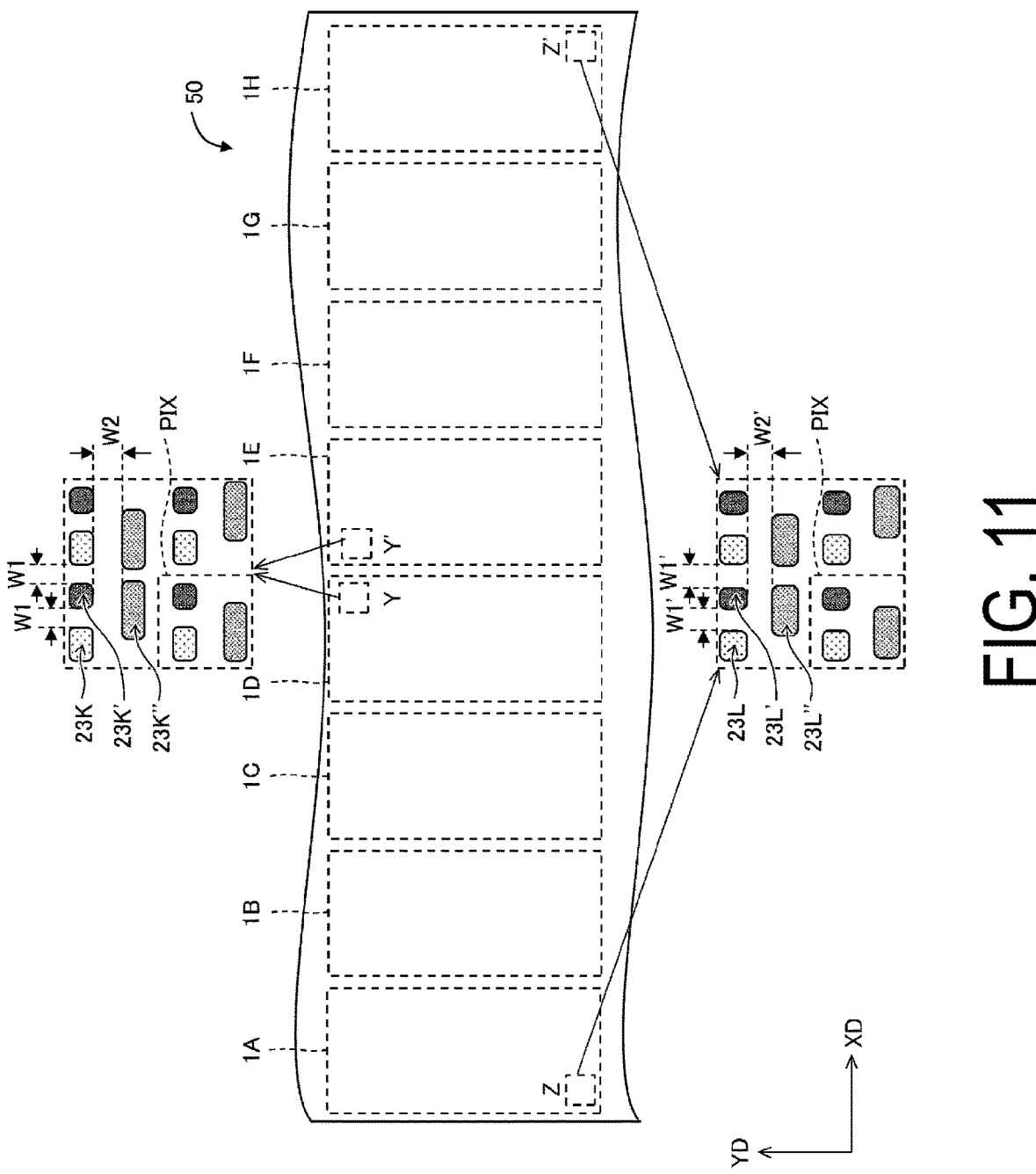
FIG. 11 is a plan view illustrating a schematic configuration of the display panel according to the second embodiment.

FIG. 11 is a plan view illustrating a schematic configuration of the display panel 50 of the second embodiment.

As illustrated in FIG. 11, the display panel 50 includes a plurality of display devices 1A to 1H. The substrate included in each of the plurality of display devices 1A to 1H is integrally formed.

The plurality of display devices 1A to 1H include the display device 1A serving as a first display device, the display device 1D and the display device 1E serving as second display devices, and the display device 1H serving as a third display device, the value of the shortest width W2/the shortest width W1 in each pixel PIX of the display device 1D and the display device 1E serving as the second display devices is larger than the value of the shortest width W2'/the shortest width W1' in each pixel PIX of the display device 1A serving as the first display device and the value of the shortest width W2'/the shortest width W1' in each pixel PIX of the display device 1H serving as the third display device, the display device 1A serving as the first display device is disposed at an end portion on one side in the first direction XD of the integrally formed substrate, the display device 1H serving as the third display device is disposed at an end portion on the other side in the first direction XD of the integrally formed substrate, and the display device 1D and the display device 1E serving as the second display devices are disposed at an intermediate position between the display device 1A serving as the first display device and the display device 1H serving as the third display device.

As illustrated in FIG. 11, in each pixel PIX of the display devices 1D and 1E serving as the second display devices, the shortest width W2 along the second direction YD between the third opening 23K" and at least one of the first opening 23K and the second opening 23K' is 27 μm, and the shortest width W1 along the first direction XD between the first opening 23K and the second opening 23K' is 18 μm. That is, the value of the shortest width W2/the shortest width W1 was set to 1.5. On the other hand, in the display device 1A serving as the first display device and the display device 1H serving as the third display device, the shortest width W2' along the second direction YD between the third opening 23L" and at least one of the first opening 23L and the second opening 23L' is 22 μm, and the shortest width W1' along the first direction XD between the first opening 23L and the second opening 23L' is 18 μm. That is, the value of the shortest width W2'/the shortest width W1' was set to 1.2.

As illustrated in FIG. 11, the display device 1B and a display device 1C are further provided between the display device 1A serving as the first display device and the display device 1D serving as the second display device, and the display device 1F and the display device 1G are further provided between the display device 1H serving as the third display device and the display device 1E serving as the second display device. For example, the value of the shortest width W2/the shortest width W1 in each pixel PIX of the display device 1B may be set to 1.3, the value of the shortest width W2/the shortest width W1 in each pixel PIX of the display device 1C may be set to 1.4, and the value of the shortest width W2/the shortest width W1 in each pixel PIX of the display device 1B and the display device 1C may be set to gradually approach 1.5, which is the value of the shortest width W2/the shortest width W1 in each pixel PIX of the display device 1D as approaching the display device 1D' from the display device 1A'. Similarly, for example, the value of the shortest width W2/the shortest width W1 in each pixel PIX of the display device 1G may be set to 1.3, the value of the shortest width W2/the shortest width W1 in each pixel PIX of the display device 1F may be set to 1.4, and the value of the shortest width W2/the shortest width W1 in each pixel PIX of the display device 1F and the display device 1G may be set to gradually approach 1.5, which is the value of the shortest width W2/the shortest width W1 in each pixel PIX of the display device 1E as approaching the display device 1E from the display device 1H.

As illustrated in FIG. 11, in each pixel PIX of the display devices 1A to 1H, the sizes of the first openings 23K and 23L, that is, the sizes of the first contact surfaces each formed by the first electrode 22 of the green light-emitting element 5G and the function layer 24G including the green light-emitting layer being in contact with each other are the same, the sizes of the second openings 23K' and 23L', that is, the sizes of the second contact surfaces each formed by the first electrode 22 of the red light-emitting element 5R and the function layer 24R including the red light-emitting layer being in contact with each other are the same, and the sizes of the third openings 23K" and 23L", that is, the sizes of the third contact surfaces each formed by the first electrode 22 of the blue light-emitting element 5B and the function layer 24B including the blue light-emitting layer being in contact with each other are the same.

Note that in each pixel PIX of the display devices 1A to 1H, the shapes of the first openings 23K and 23L, that is, the shapes of the first contact surfaces formed by the first electrode 22 of the green light-emitting element 5G and the function layer 24G including the green light-emitting layer being in contact with each other are different from each other, the shapes of the second openings 23K' and 23L', that is, the shapes of the second contact surfaces formed by the first electrode 22 of the red light-emitting element 5R and the function layer 24R including the red light-emitting layer being in contact with each other are different from each other, and the shapes of the third openings 23K" and 23L", that is, the shapes of the third contact surfaces formed by the first electrode 22 of the blue light-emitting element 5B and the function layer 24B including the blue light-emitting layer being in contact with each other are different from each other.

In the present embodiment, in each pixel PIX in one of the display devices 1A to 1H, the value of the shortest width W2/the shortest width W1 is set to be the same. However, no such limitation is intended.

As described above, in each pixel PIX of each of the plurality of display devices 1A to 1H included in the display panel 50, the light-emitting area of the light-emitting layer of each color can be set to the same, and by performing the dividing process of dividing the large display panel 50, each of the obtained display devices 1A to 1H becomes a display device of the same grade.

Third Embodiment

Next, a third embodiment according to the disclosure will be described with reference to FIG. 12. Each of display devices 1A' to 1H' included in a large display panel 50' of the present embodiment is different from the above-described second embodiment in that the light-emitting area of the light-emitting layer of each color in each pixel PIX of some display devices is different. Other configurations are as described in the second embodiment. For convenience of explanation, components having the same functions as those described in diagrams of the second embodiment are appended with the same reference signs, and descriptions thereof may be omitted.

In the present embodiment, a case will be described as an example in which a vapor deposition mask including a plurality of divided masks DM's illustrated in FIG. 10. However, no such limitation is intended, and for example, the vapor deposition mask M including the plurality of divided masks DM illustrated in (b) of FIG. 1 may be used.

Figure 12:
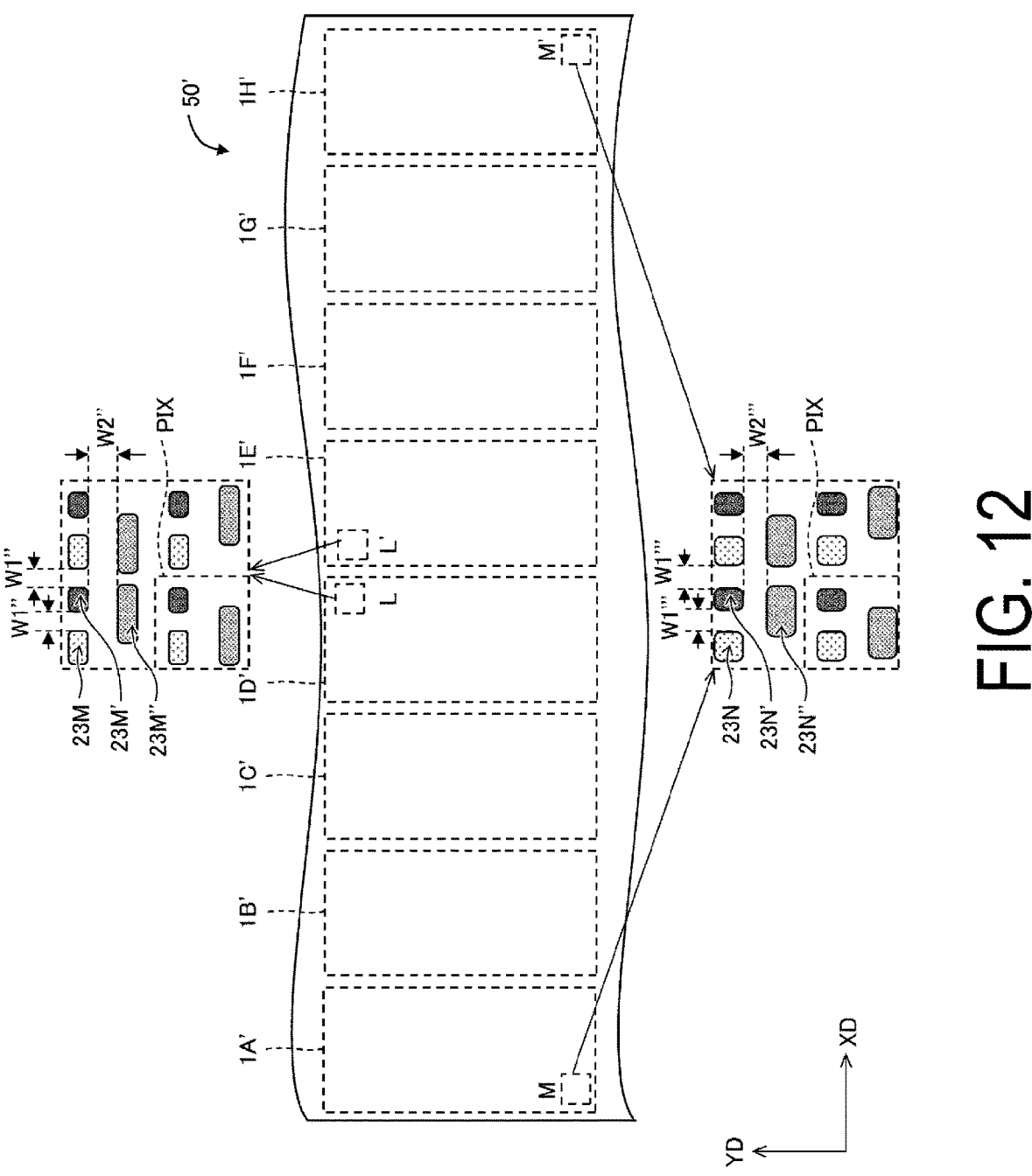
FIG. 12 is a plan view illustrating a schematic configuration of a display panel according to a third embodiment.

FIG. 12 is a plan view illustrating a schematic configuration of the display panel 50' according to the third embodiment.

As illustrated in FIG. 12, the display panel 50' includes a plurality of display devices 1A to 1H'. The substrate included in each of the plurality of display devices 1A' to 1H' is integrally formed.

The plurality of display devices 1A' to 1H' include the display device 1A' serving as a first display device, the display device 1D' and the display device 1E' serving as second display devices, and the display device 1H' serving as a third display device, the value of the shortest width W2"/the shortest width W1" in each pixel PIX of the display device 1D' and the display device 1E' serving as the second display devices is larger than the value of the shortest width W2'"/the shortest width W1'" in each pixel PIX of the display device 1A serving as the first display device and the value of the shortest width W2'"/the shortest width W1'" in each pixel PIX of the display device 1H' serving as the third display device, the display device 1A' serving as the first display device is disposed at an end portion on one side in the first direction XD of the integrally formed substrate, the display device 1H' serving as the third display device is disposed at an end portion on the other side in the first direction XD of the integrally formed substrate, and the display device 1D' and the display device 1E' serving as the second display devices are disposed at an intermediate position between the display device 1A' serving as the first display device and the display device 1H' serving as the third display device.

A size obtained by combining a size of a first opening 23M, that is, the size of the first contact surface formed by the first electrode 22 of the green light-emitting element 5G and the function layer 24G including the green light-emitting layer being in contact with each other, a size of a second opening 23M', that is, the size of the second contact surface formed by the first electrode 22 of the red light-emitting element 5R and the function layer 24R including the red light-emitting layer being in contact with each other, and a size of a third opening 23M", that is, the size of the third contact surface formed by the first electrode 22 of the blue light-emitting element 5B and the function layer 24B including the blue light-emitting layer being in contact with each other in each pixel PIX of the display devices 1D' and 1E' serving as the second display devices is smaller than a size obtained by combining a size of a first opening 23N, that is, the size of the first contact surface formed by the first electrode 22 of the green light-emitting element 5G and the function layer 24G including the green light-emitting layer being in contact with each other, a size of a second opening 23N', that is, the size of the second contact surface formed by the first electrode 22 of the red light-emitting element 5R and the function layer 24R including the red light-emitting layer being in contact with each other, and a size of a third opening 23N", that is, the size of the third contact surface formed by the first electrode 22 of the blue light-emitting element 5B and the function layer 24B including the blue light-emitting layer being in contact with each other in each pixel PIX of the display device 1A' serving as the first display device and the display device 1H' serving as the third display device.

As illustrated in FIG. 12, in each pixel PIX of the display devices 1D' and 1E' serving as the second display devices, the shortest width W2" along the second direction YD between the third opening 23M" and at least one of the first opening 23M and the second opening 23M' is 27 μm, and the shortest width W1" along the first direction XD between the first opening 23M and the second opening 23M' is 18 μm. That is, the value of the shortest width W2"/the shortest width W1" was set to 1.5. On the other hand, in the display device 1A' serving as the first display device and the display device 1H' serving as the third display device, the shortest width W2'" along the second direction YD between the third opening 23N" and at least one of the first opening 23N and the second opening 23N' is 22 μm, and the shortest width W1'" along the first direction XD between the first opening 23N and the second opening 23N' is 18 μm. That is, the value of the shortest width W2'"/the shortest width W1'" was set to 1.2.

As illustrated in FIG. 12, the display device 1B and a display device 1C' are further provided between the display device 1A serving as the first display device and the display device 1D' serving as the second display device, and the display device 1F' and the display device 1G' are further provided between the display device 1H' serving as the third display device and the display device 1E' serving as the second display device. For example, the value of the shortest width W2/the shortest width W1 in each pixel PIX of the display device 1B' may be set to 1.3, the value of the shortest width W2/the shortest width W1 in each pixel PIX of the display device 1C' may be set to 1.4, and the value of the shortest width W2/the shortest width W1 in each pixel PIX of the display device 1B' and the display device 1C' may be set to gradually approach 1.5, which is the value of the shortest width W2"/the shortest width W1" in each pixel PIX of the display device 1D' as approaching the display device 1D' from the display device 1A'. Similarly, for example, the value of the shortest width W2/the shortest width W1 in each pixel PIX of the display device 1G' may be set to 1.3, the value of the shortest width W2/the shortest width W1 in each pixel PIX of the display device 1F' may be set to 1.4, and the value of the shortest width W2/the shortest width W1 in each pixel PIX of the display device 1F' and the display device 1G' may be set to gradually approach 1.5, which is the value of the shortest width W2"/the shortest width W1" in each pixel PIX of the display device 1E' as approaching the display device 1H'.

As illustrated in FIG. 12, a size obtained by combining a size of the first opening, that is, the size of the first contact surface formed by the first electrode 22 of the green light-emitting element 5G and the function layer 24G including the green light-emitting layer being in contact with each other, a size of the second opening, that is, the size of the second contact surface formed by the first electrode 22 of the red light-emitting element 5R and the function layer 24R including the red light-emitting layer being in contact with each other, and the size of a third opening, that is, the size of the third contact surface formed by the first electrode 22 of the blue light-emitting element 5B and the function layer 24B including the blue light-emitting layer being in contact with each other in each pixel PIX of the display device 1B' and the display device 1C' provided between the display device 1A' serving as the first display device, and the display device 1D' serving as the second display device may be set to gradually approach a size obtained by combining the size of the first contact surface, the size of the second contact surface, and the size of the third contact surface in each pixel PIX of the display device 1D' as approaching the display device 1D' from the display device 1A'. Similarly, a size obtained by combining a size of the first opening, that is, the size of the first contact surface formed by the first electrode 22 of the green light-emitting element 5G and the function layer 24G including the green light-emitting layer being in contact with each other, a size of the second opening, that is, the size of the second contact surface formed by the first electrode 22 of the red light-emitting element 5R and the function layer 24R including the red light-emitting layer being in contact with each other, and the size of a third opening, that is, the size of the third contact surface formed by the first electrode 22 of the blue light-emitting element 5B and the function layer 24B including the blue light-emitting layer being in contact with each other in each pixel PIX of the display device 1F' and the display device 1G' provided between the display device 1H' serving as the third display device, and the display device 1E serving as the second display device may be set to gradually approach a size obtained by combining the size of the first contact surface, the size of the second contact surface, and the size of the third contact surface in each pixel PIX of the display device 1E' as approaching the display device 1E' from the display device 1H'.

In the present embodiment, in each pixel PIX in one of the display devices A' to 1H', the value of the shortest width W2/the shortest width W1 is set to be the same. However, no such limitation is intended.

As described above, in each pixel PIX of each of the plurality of display devices 1A' to 1H' included in the display panel 50', the light-emitting area of the light-emitting layer of each color can be set to be different, and by performing the dividing process of dividing the large display panel 50', at least some of the obtained display devices 1A' to 1H' can be made a display device of a different grade.

Supplement

First Aspect

A display device including
a substrate;

a first light-emitting element, a second light-emitting element, and a third light-emitting element on the substrate, each including a first electrode, a function layer including a light-emitting layer, and a second electrode in this order from the substrate side; and a plurality of pixels each including the first light-emitting element, the second light-emitting element, and the third light-emitting element, wherein a shortest width W1 along a first direction between a first contact surface formed by the first electrode of the first light-emitting element and the function layer of the first light-emitting element being in contact with each other and a second contact surface formed by the first electrode of the second light-emitting element and the function layer of the second light-emitting element being in contact with each other is smaller than a shortest width W2 along a second direction orthogonal to the first direction between a third contact surface formed by the first electrode of the third light-emitting element and the function layer of the third light-emitting element being in contact with each other and at least one of the first contact surface and the second contact surface.

Second Aspect

The display device according to the first aspect, wherein the first light-emitting element and the second light-emitting element are disposed adjacent to each other for each of the plurality of pixels in one of an (N−1)-th row and an N-th row (N is an even number of 2 or greater) along the first direction, the third light-emitting element is disposed for each of the plurality of pixels in the other of the (N−1)-th row and the N-th row, the first light-emitting element includes, as the light-emitting layer, a first light-emitting layer, the second light-emitting element includes, as the light-emitting layer, a second light-emitting layer having an emission peak wavelength different from an emission peak wavelength of the first light-emitting layer, and the third light-emitting element includes, as the light-emitting layer, a third light-emitting layer having an emission peak wavelength different from the emission peak wavelengths of the respective first light-emitting layer and the second light-emitting layer.

Third Aspect

The display device according to the second aspect, wherein a width of the third contact surface in the first direction is larger than a width obtained by combining one of a width of the first contact surface in the first direction and a width of the second contact surface in the first direction and a width of the shortest width W1, and the first light-emitting element and the second light-emitting element are alternately disposed in the one of the (N−1)-th row and the N-th row.

Fourth Aspect

The display device according to the second aspect or the third aspect, wherein a size of the third contact surface is larger than a size of the first contact surface and a size of the second contact surface.

Fifth Aspect

The display device according to any one of the second aspect to the fourth aspect, wherein the first pixel, the second pixel, and the third pixel are three pixels adjacent to each other disposed in this order along the first direction, and a shortest width W3 along the first direction between the third contact surface included in one of the first pixel and the third pixel and the third contact surface included in the second pixel is smaller than a shortest width W4 along the first direction between the third contact surface included in the other of the first pixel and the third pixel and the third contact surface included in the second pixel.

Sixth Aspect

The display device according to any one of the second aspect to the fifth aspect, wherein a value of the shortest width W2/the shortest width W1 is 1.2 or greater and 1.5 or less.

Seventh Aspect

The display device according to any one of the second aspect to the sixth aspect further including an edge cover layer covering an end portion of each of the first electrode of the first light-emitting element, the first electrode of the second light-emitting element, and the first electrode of the third light-emitting element, wherein the edge cover layer includes a first opening having the same shape as the first contact surface, a second opening having the same shape as the second contact surface, and a third opening having the same shape as the third contact surface.

Eighth Aspect

The display device according to any one of the second aspect to the seventh aspect, wherein the first light-emitting layer is a light-emitting layer configured to emit red light, the second light-emitting layer is a light-emitting layer configured to emit green light, and the third light-emitting layer is a light-emitting layer configured to emit blue light.

Ninth Aspect

A display panel including a plurality of the display devices according to any one of the first aspect to the eighth aspect, wherein the substrate included in each of the plurality of display devices is integrally formed, the plurality of display devices include a first display device, a second display device, and a third display device, a value of the shortest width W2/the shortest width W1 in each of the plurality of pixels of the second display device is larger than a value of the shortest width W2/the shortest width W1 in each of the plurality of pixels of the first display device and a value of the shortest width W2/the shortest width W1 in each pixel of the third display device, the first display device is disposed at an end portion on one side in the first direction of the substrate being integrally formed, the third display device is disposed at an end portion on the other side in the first direction of the substrate being integrally formed, and the second display device is disposed at an intermediate position between the first display device and the third display device.

Tenth Aspect

The display panel according to the ninth aspect further including the plurality of display devices between the first display device and the second display device and between the third display device and the second display device, wherein a value of the shortest width W2/the shortest width W1 in each of the plurality of pixels of each of the plurality of display devices provided between the first display device and the second display device gradually approaches a value of the shortest width W2/the shortest width W1 in each of the plurality of pixels of the second display device toward the second display device from the first display device, and a value of the shortest width W2/the shortest width W1 in each of the plurality of pixels of each of the plurality of display devices provided between the third display device and the second display device gradually approaches a value of the shortest width W2/the shortest width W1 in each of the plurality of pixels of the second display device toward the second display device from the third display device.

Eleventh Aspect

The display panel according to the ninth aspect or the tenth aspect, wherein in each of all of the display devices including the first display device, the second display device, and the third display device, a plurality of the first contact surfaces have the same size, a plurality of the second contact surfaces have the same size, and a plurality of the third contact surfaces have the same size.

Twelfth Aspect

The display panel according to the ninth aspect or the tenth aspect, wherein a size obtained by combining a size of the first contact surface, a size of the second contact surface, and a size of the third contact surface in each of the plurality of pixels of the second display device is smaller than a size obtained by combining a size of the first contact surface, a size of the second contact surface, and a size of the third contact surface in each of the plurality of pixels of the first display device and a size obtained by combining a size of the first contact surface, a size of the second contact surface, and a size of the third contact surface in each of the plurality of pixels of the third display device.

Thirteenth Aspect

The display panel according to the tenth aspect, wherein a size obtained by combining a size of the first contact surface, a size of the second contact surface, and a size of the third contact surface in each of the plurality of pixels of the second display device is smaller than a size obtained by combining a size of the first contact surface, a size of the second contact surface, and a size of the third contact surface in each of the plurality of pixels of the first display device, and a size obtained by combining a size of the first contact surface, a size of the second contact surface, and a size of the third contact surface in each of the plurality of pixels of the third display device, a size obtained by combining a size of the first contact surface, a size of the second contact surface, and a size of the third contact surface in each of the plurality of pixels of each of the plurality of display devices provided between the first display device and the second display device gradually approaches a size obtained by combining a size of the first contact surface, a size of the second contact surface, and a size of the third contact surface in each of the plurality of pixels of the second display device toward the second display device from the first display device toward, and a size obtained by combining a size of the first contact surface, a size of the second contact surface, and a size of the third contact surface in each of the plurality of pixels of each of the plurality of display devices provided between the third display device and the second display device gradually approaches a size obtained by combining a size of the first contact surface, a size of the second contact surface, and a size of the third contact surface in each of the plurality of pixels of the second display device toward the second display device from the third display device.

Fourteenth Aspect

A manufacturing method of a display device, the display device including, on a substrate, a plurality of pixels each including a first light-emitting element, a second light-emitting element, and a third light-emitting element, the manufacturing method including a first electrode forming process of forming a first electrode on the substrate, an edge cover layer forming process of forming an edge cover layer, the edge cover layer covering an end portion of each of the first electrode of the first light-emitting element, the first electrode of the second light-emitting element, and the first electrode of the third light-emitting element, including a first opening exposing a part of the first electrode of the first light-emitting element, a second opening exposing a part of the first electrode of the second light-emitting element, and a third opening exposing a part of the first electrode of the third light-emitting element, the first opening and the second opening being disposed to be adjacent to each other for each of the plurality of pixels in one of an (N−1)-th row and an N-th row (N is an even number of 2 or greater) along the first direction, the third opening is disposed for each of the plurality of pixels in the other of the (N−1)-th row and the N-th row, and a shortest width W1 along the first direction between the first opening and the second opening being smaller than a shortest width W2 along a second direction orthogonal to the first direction between the third opening and at least one of the first opening and the second opening, forming a first light-emitting layer of the first light-emitting element, a second light-emitting layer of the second light-emitting element, and a third light-emitting layer of the third light-emitting element, and forming a second electrode on the first light-emitting layer of the first light-emitting element, on the second light-emitting layer of the second light-emitting element, and on the third light-emitting layer of the third light-emitting element.

Fifteenth Aspect

The manufacturing method of a display device according to the fourteenth aspect, wherein the forming a light-emitting layer forming includes forming a first light-emitting layer on the first electrode of the first light-emitting element exposed via the first opening by using a first vapor deposition mask including a plurality of first vapor deposition openings formed corresponding to the positions of the first openings in the same shape and at the same pitch and stretched in the first direction and a direction opposite to the first direction, forming a second light-emitting layer having an emission peak wavelength different from an emission peak wavelength of the first light-emitting layer on the first electrode of the second light-emitting element exposed via the second opening by using a second vapor deposition mask including a plurality of second vapor deposition openings formed corresponding to the positions of the second openings in the same shape and at the same pitch and stretched in the first direction and the direction opposite to the first direction, and forming a third light-emitting layer having an emission peak wavelength different from the emission peak wavelengths of the respective first light-emitting layer and the second light-emitting layer on the first electrode of the third light-emitting element exposed via the third opening by using a third vapor deposition mask including a plurality of third vapor deposition openings formed corresponding to the positions of a plurality of the third openings in the same shape and at the same pitch and stretched in the first direction and the direction opposite to the first direction.

Sixteenth Aspect

The manufacturing method of a display device according to the fourteenth aspect or the fifteenth aspect, wherein a plurality of the display devices are further included, the substrate included in each of the plurality of display device is integrally formed, the plurality of display devices include a first display device, a second display device, and a third display device, the first display device is disposed at an end portion on one side in the first direction of the substrate being integrally formed, the third display device is disposed at an end portion on the other side in the first direction of the substrate being integrally formed, the second display device is disposed at an intermediate position between the first display device and the third display device, in the forming an edge cover layer, the edge cover layer is formed such that a value of the shortest width W2/the shortest width W1 in each of the plurality of pixels of the second display device is larger than a value of the shortest width W2/the shortest width W1 in each of the plurality of pixels of the first display device and a value of the shortest width W2/the shortest width W1 in each of the plurality of pixels of the third display device, and the manufacturing method further includes dividing all the display devices including the first display device, the second display device, and the third display device into display devices.

Seventeenth Aspect

The manufacturing method of a display device according to the sixteenth aspect,
wherein the plurality of display devices are further included between the first display device and the second display device and between the third display device and the second display device, and
in the forming an edge cover layer, the edge cover layer is formed such that a value of the shortest width W2/the shortest width W1 in each of the plurality of pixels of each of the plurality of display devices provided between the first display device and the second display device gradually approaches a value of the shortest width W2/the shortest width W1 in each of the plurality of pixels of the second display device toward the second display device from the first display device, and
a value of the shortest width W2/the shortest width W1 in each of the plurality of pixels of each of the plurality of display devices provided between the third display device and the second display device gradually approaches a value of the shortest width W2/the shortest width W1 in each of the plurality of pixels of the second display device toward the second display device from the third display device.

Eighteenth Aspect

The manufacturing method of a display device according to the sixteenth aspect or the seventeenth aspect,
wherein in the forming an edge cover layer, the edge cover layer is formed such that in each of all of the display devices including the first display device, the second display device, and the third display device,
the plurality of the first openings have the same size,
the plurality of the second openings have the same size, and
the plurality of the third openings have the same size.

Nineteenth Aspect

The manufacturing method of a display device according to the sixteenth aspect or the seventeenth aspect, wherein in the forming an edge cover layer, the edge cover layer is formed such that a size obtained by combining a size of the first opening, a size of the second opening, and a size of the third opening in each of the plurality of pixels of the second display device is smaller than a size obtained by combining a size of the first opening, a size of the second opening, and a size of the third opening in each of the plurality of pixels of the first display device and a size obtained by combining a size of the first opening, a size of the second opening, and a size of the third opening in each of the plurality of pixels of the third display device.

Twentieth Aspect

The manufacturing method of a display device according to the seventeenth aspect,

wherein in the forming an edge cover layer, the edge cover layer is formed such that a size obtained by combining a size of the first opening, a size of the second opening, and a size of the third opening in each of the plurality of pixels of the second display device is smaller than a size obtained by combining a size of the first opening, a size of the second opening, and a size of the third opening in each of the plurality of pixels of the first display device, and a size obtained by combining a size of the first opening, a size of the second opening, and a size of the third opening in each of the plurality of pixels of the third display device,
a size obtained by combining a size of the first opening, a size of the second opening, and a size of the third opening in each of the plurality of pixels of each of the plurality of display devices
provided between the first display device and the second display device gradually approaches a size obtained by combining a size of the first opening, a size of the second opening, and a size of the third opening in each of the plurality of pixels of the second display device toward the second display device from the first display device, and
a size obtained by combining a size of the first opening, a size of the second opening, and a size of the third opening in each of the plurality of pixels of each of the plurality of display devices provided between the third display device and the second display device gradually approaches a size obtained by combining a size of the first opening, a size of the second opening, and a size of the third opening in each of the plurality of pixels of the second display device as the toward the second display device from the third display device.

APPENDIX

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

INDUSTRIAL APPLICABILITY

The disclosure can be utilized for a display device, a display panel, and a manufacturing method of the display device.

The invention claimed is:
1. A display device including
a substrate;
a first light-emitting element, a second light-emitting element, and a third light-emitting element on the substrate, each including a first electrode, a function layer including a light-emitting layer, and a second electrode in this order from the substrate side; and
a plurality of pixels each including the first light-emitting element, the second light-emitting element, and the third light-emitting element,
wherein a shortest width W1 along a first direction between a first contact surface formed by the first electrode of the first light-emitting element and the function layer of the first light-emitting element being in contact with each other and a second contact surface formed by the first electrode of the second light- emitting element and the function layer of the second light-emitting element being in contact with each other is smaller than a shortest width W2 along a second direction orthogonal to the first direction between a third contact surface formed by the first electrode of the third light-emitting element and the function layer of the third light-emitting element being in contact with each other and at least one of the first contact surface and the second contact surface.

2. The display device according to claim 1, wherein the first light-emitting element and the second light-emitting element are disposed adjacent to each other for each of the plurality of pixels in one of an (N−1)-th row and an N-th row (Nis an even number of 2 or greater) along the first direction, the third light-emitting element is disposed for each of the plurality of pixels in the other of the (N−1)-th row and the N-th row, the first light-emitting element includes, as the light-emitting layer, a first light-emitting layer, the second light-emitting element includes, as the light-emitting layer, a second light-emitting layer having an emission peak wavelength different from an emission peak wavelength of the first light-emitting layer, and the third light-emitting element includes, as the light-emitting layer, a third light-emitting layer having an emission peak wavelength different from the emission peak wavelengths of the respective first light-emitting layer and the second light-emitting layer.

3. The display device according to claim 2, wherein a width of the third contact surface in the first direction is larger than a width obtained by combining one of a width of the first contact surface in the first direction and a width of the second contact surface in the first direction, and a width of the shortest width W1, and the first light-emitting element and the second light-emitting element are alternately disposed in the one of the (N−1)-th row and the N-th row.

4. The display device according to claim 2, wherein a size of the third contact surface is larger than a size of the first contact surface and a size of the second contact surface.

5. The display device according to claim 2, wherein the first pixel, the second pixel, and the third pixel are three pixels adjacent to each other disposed in this order along the first direction, and a shortest width W3 along the first direction between the third contact surface included in one of the first pixel and the third pixel and the third contact surface included in the second pixel is smaller than a shortest width W4 along the first direction between the third contact surface included in the other of the first pixel and the third pixel and the third contact surface included in the second pixel.

6. The display device according to claim 2, wherein a value of the shortest width W2/the shortest width W1 is 1.2 or greater and 1.5 or less.

7. The display device according to claim 2 further comprising:
an edge cover layer covering an end portion of each of the first electrode of the first light-emitting element, the first electrode of the second light-emitting element, and the first electrode of the third light-emitting element, wherein the edge cover layer includes a first opening having the same shape as the first contact surface, a second opening having the same shape as the second contact surface, and a third opening having the same shape as the third contact surface.

8. The display device according to claim 2, wherein the first light-emitting layer is a light-emitting layer configured to emit red light, the second light-emitting layer is a light-emitting layer configured to emit green light, and the third light-emitting layer is a light-emitting layer configured to emit blue light.

9. A display panel comprising:
a plurality of the display devices according to claim 1, wherein the substrate included in each of the plurality of display devices is integrally formed, the plurality of display devices include a first display device, a second display device, and a third display device, a value of the shortest width W2/the shortest width W1 in each of the plurality of pixels of the second display device is larger than a value of the shortest width W2/the shortest width W1 in each of the plurality of pixels of the first display device and a value of the shortest width W2/the shortest width W1 in each of the plurality of pixels of the third display device, the first display device is disposed at an end portion on one side in the first direction of the substrate being integrally formed, the third display device is disposed at an end portion on the other side in the first direction of the substrate being integrally formed, and the second display device is disposed at an intermediate position between the first display device and the third display device.

10. The display panel according to claim 9 further comprising:
the plurality of display devices between the first display device and the second display device and between the third display device and the second display device, wherein a value of the shortest width W2/the shortest width W1 in each of the plurality of pixels of each of the plurality of display devices provided between the first display device and the second display device gradually approaches a value of the shortest width W2/the shortest width W1 in each of the plurality of pixels of the second display device toward the second display device from the first display device, and a value of the shortest width W2/the shortest width W1 in each of the plurality of pixels of each of the plurality of display devices provided between the third display device and the second display device gradually approaches a value of the shortest width W2/the shortest width W1 in each of the plurality of pixels of the second display device toward the second display device from the third display device.

11. The display panel according to claim 9, wherein in each of all of the display devices including the first display device, the second display device, and the third display device, a plurality of the first contact surfaces have the same size, a plurality of the second contact surfaces have the same size, and a plurality of the third contact surfaces have the same size.

12. The display panel according to claim 9, wherein a size obtained by combining a size of the first contact surface, a size of the second contact surface, and a size of the third contact surface in each of the plurality of pixels of the second display device is smaller than a size obtained by combining a size of the first contact surface, a size of the second contact surface, and a size of the third contact surface in each of the plurality of pixels of the first display device and a size obtained by combining a size of the first contact surface, a size of the second contact surface, and a size of the third contact surface in each of the plurality of pixels of the third display device.

13. The display panel according to claim 10, wherein a size obtained by combining a size of the first contact surface, a size of the second contact surface, and a size of the third contact surface in each of the plurality of pixels of the second display device is smaller than a size obtained by combining a size of the first contact surface, a size of the second contact surface, and a size of the third contact surface in each of the plurality of pixels of the first display device, and a size obtained by combining a size of the first contact surface, a size of the second contact surface, and a size of the third contact surface in each of the plurality of pixels of the third display device, a size obtained by combining a size of the first contact surface, a size of the second contact surface, and a size of the third contact surface in each of the plurality of pixels of each of the plurality of display devices provided between the first display device and the second display device gradually approaches a size obtained by combining a size of the first contact surface, a size of the second contact surface, and a size of the third contact surface in each of the plurality of pixels of the second display device toward the second display device from the first display device toward, and a size obtained by combining a size of the first contact surface, a size of the second contact surface, and a size of the third contact surface in each of the plurality of pixels of each of the plurality of display devices provided between the third display device and the second display device gradually approaches a size obtained by combining a size of the first contact surface, a size of the second contact surface, and a size of the third contact surface in each of the plurality of pixels of the second display device toward the second display device from the third display device.

14. A manufacturing method of a display device, the display device including, on a substrate, a plurality of pixels each including a first light-emitting element, a second light-emitting element, and a third light-emitting element, the manufacturing method including forming a first electrode on the substrate, forming an edge cover layer, the edge cover layer covering an end portion of each of the first electrode of the first light-emitting element, the first electrode of the second light-emitting element, and the first electrode of the third light-emitting element, including a first opening exposing a part of the first electrode of the first light-emitting element, a second opening exposing a part of the first electrode of the second light-emitting element, and a third opening exposing a part of the first electrode of the third light-emitting element, the first opening and the second opening being disposed to be adjacent to each other for each of the plurality of pixels in one of an (N−1)-th row and an N-th row (N is an even number of 2 or greater) along the first direction, the third opening is disposed for each of the plurality of pixels in the other of the (N−1)-th row and the N-th row, and a shortest width W1 along the first direction between the first opening and the second opening being smaller than a shortest width W2 along a second direction orthogonal to the first direction between the third opening and at least one of the first opening and the second opening, forming a first light-emitting layer of the first light-emitting element, a second light-emitting layer of the second light-emitting element, and a third light-emitting layer of the third light-emitting element, and forming a second electrode on the first light-emitting layer of the first light-emitting element, on the second light-emitting layer of the second light-emitting element, and on the third light-emitting layer of the third light-emitting element.

15. The manufacturing method of a display device according to claim 14, wherein the forming a light-emitting layer includes forming a first light-emitting layer on the first electrode of the first light-emitting element exposed via the first opening by using a first vapor deposition mask including a plurality of first vapor deposition openings formed corresponding to positions of a plurality of the first openings in the same shape and at the same pitch and stretched in the first direction and a direction opposite to the first direction, forming a second light-emitting layer having an emission peak wavelength different from an emission peak wavelength of the first light-emitting layer on the first electrode of the second light-emitting element exposed via the second opening by using a second vapor deposition mask including a plurality of second vapor deposition openings formed corresponding to positions of a plurality of the second openings in the same shape and at the same pitch and stretched in the first direction and the direction opposite to the first direction, and forming a third light-emitting layer having an emission peak wavelength different from the emission peak wavelengths of the respective first light-emitting layer and the second light-emitting layer on the first electrode of the third light-emitting element exposed via the third opening by using a third vapor deposition mask including a plurality of third vapor deposition openings formed corresponding to positions of a plurality of the third openings in the same shape and at the same pitch and stretched in the first direction and the direction opposite to the first direction.

16. The manufacturing method of a display device according to claim 14, wherein a plurality of the display devices are further included, the substrate included in each of the plurality of display devices is integrally formed, the plurality of display devices include a first display device, a second display device, and a third display device, the first display device is disposed at an end portion on one side in the first direction of the substrate being integrally formed, the third display device is disposed at an end portion on the other side in the first direction of the substrate being integrally formed, the second display device is disposed at an intermediate position between the first display device and the third display device, in the forming an edge cover layer, the edge cover layer is formed, and a value of the shortest width W2/the shortest width W1 in each of the plurality of pixels of the second display device is larger than a value of the shortest width W2/the shortest width W1 in each of the plurality of pixels of the first display device and a value of the shortest width W2/the shortest width W1 in each of the plurality of pixels of the third display device, and the manufacturing method further includes dividing all the display devices including the first display device, the second display device, and the third display device into display devices.

17. The manufacturing method of a display device according to claim 16, wherein the plurality of display devices are further included between the first display device and the second display device and between the third display device and the second display device, and in the forming an edge cover layer, the edge cover layer is formed, and a value of the shortest width W2/the shortest width W1 in each of the plurality of pixels of each of the plurality of display devices provided between the first display device and the second display device gradually approaches a value of the shortest width W2/the shortest width W1 in each of the plurality of pixels of the second display device toward the second display device from the first display device, and a value of the shortest width W2/the shortest width W1 in each of the plurality of pixels of each of the plurality of display devices provided between the third display device and the second display device gradually approaches a value of the shortest width W2/the shortest width W1 in each of the plurality of pixels of the second display device toward the second display device from the third display device.

18. The manufacturing method of a display device according to claim 16, wherein in the forming an edge cover layer, the edge cover layer is formed, and in each of all of the display devices including the first display device, the second display device, and the third display device, the plurality of the first openings have the same size, the plurality of the second openings have the same size, and the plurality of the third openings have the same size.

19. The manufacturing method of a display device according to claim 16, wherein in the forming an edge cover layer, the edge cover layer is formed, and a size obtained by combining a size of the first opening, a size of the second opening, and a size of the third opening in each of the plurality of pixels of the second display device is smaller than a size obtained by combining a size of the first opening, a size of the second opening, and a size of the third opening in each of the plurality of pixels of the first display device and a size obtained by combining a size of the first opening, a size of the second opening, and a size of the third opening in each of the plurality of pixels of the third display device.

20. The manufacturing method of a display device according to claim 17, wherein in the forming an edge cover layer, the edge cover layer is formed, and a size obtained by combining a size of the first opening, a size of the second opening, and a size of the third opening in each of the plurality of pixels of the second display device is smaller than a size obtained by combining a size of the first opening, a size of the second opening, and a size of the third opening in each of the plurality of pixels of the first display device, and a size obtained by combining a size of the first opening, a size of the second opening, and a size of the third opening in each of the plurality of pixels of the third display device, a size obtained by combining a size of the first opening, a size of the second opening, and a size of the third opening in each of the plurality of pixels of each of the plurality of display devices provided between the first display device and the second display device gradually approaches a size obtained by combining a size of the first opening, a size of the second opening, and a size of the third opening in each of the plurality of pixels of the second display device toward the second display device from the first display device, and a size obtained by combining a size of the first opening, a size of the second opening, and a size of the third opening in each of the plurality of pixels of each of the plurality of display devices provided between the third display device and the second display device gradually approaches a size obtained by combining a size of the first opening, a size of the second opening, and a size of the third opening in each of the plurality of pixels of the second display device toward the second display device from the third display device.

* * * * *